(12) United States Patent
Lee et al.

(10) Patent No.: US 10,950,443 B2
(45) Date of Patent: Mar. 16, 2021

(54) METHOD FOR FORMING PATTERNS

(71) Applicant: SK hynix Inc., Gyeonggi-do (KR)

(72) Inventors: Han-Chul Lee, Gyeonggi-do (KR);
Won-Hyuck Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/663,875

(22) Filed: Oct. 25, 2019

(65) Prior Publication Data
US 2020/0279735 A1 Sep. 3, 2020

(30) Foreign Application Priority Data
Feb. 28, 2019 (KR) .................. 10-2019-0024156

(51) Int. Cl.
| | |
|---|---|
| *H01L 21/033* | (2006.01) |
| *H01L 21/311* | (2006.01) |
| *H01L 21/308* | (2006.01) |
| *H01L 21/02* | (2006.01) |

(52) U.S. Cl.
CPC ...... *H01L 21/0337* (2013.01); *H01L 21/0214* (2013.01); *H01L 21/02115* (2013.01); *H01L 21/02123* (2013.01); *H01L 21/02164* (2013.01); *H01L 21/02282* (2013.01); *H01L 21/0332* (2013.01); *H01L 21/3086* (2013.01); *H01L 21/31144* (2013.01)

(58) Field of Classification Search
CPC ... H01L 21/02; H01L 21/021; H01L 21/0211; H01L 21/02115; H01L 21/0212; H01L 21/02123; H01L 21/0214; H01L 21/0216; H01L 21/02164; H01L 21/022; H01L 21/0228; H01L 21/02282; H01L 21/03; H01L 21/033; H01L 21/0337; H01L 21/30; H01L 21/308; H01L 21/3086
USPC ...................................... 438/702
See application file for complete search history.

(56) References Cited

U.S. PATENT DOCUMENTS

| | | |
|---|---|---|
| 9,012,326 B2 | 4/2015 | Kim et al. |
| 9,099,403 B2 | 8/2015 | Kim et al. |
| 9,257,297 B2 | 2/2016 | Gwak |
| 2016/0146736 A1* | 5/2016 | Chen .................. G01N 21/658 356/301 |
| 2017/0338121 A1 | 11/2017 | Lupo |

* cited by examiner

*Primary Examiner* — Monica D Harrison
(74) *Attorney, Agent, or Firm* — IP & T Group LLP

(57) ABSTRACT

A method for forming patterns includes forming an etch barrier stack where a first sacrificial material, first mask lines, a second sacrificial material and second mask lines intersecting with the first mask lines are sequentially disposed on an etch target material, etching the second an first sacrificial materials using the second and first mask lines as etch masks, to form island-shaped sacrificial openings isolated from one another in the first sacrificial material, forming island-shaped sacrificial pillars to fill the island-shaped sacrificial openings, etching the first mask lines to form island-shaped masks at intersections between the first mask lines and the second mask lines, and etching the first sacrificial material using the island-shaped masks and the island-shaped sacrificial pillars as etch masks, to form a sacrificial barrier including island-shaped openings isolated from one another to expose the etch target material.

20 Claims, 32 Drawing Sheets

METHOD FOR FORMING PATTERNS

CROSS-REFERENCE TO RELATED APPLICATIONS

The present application claims priority to Korean Patent Application No. 10-2019-0024156, filed on Feb. 28, 2019, which is incorporated herein by reference in its entirety.

BACKGROUND

1. Field

Exemplary embodiments of the present invention relate generally to a method for fabricating a semiconductor device and, more particularly, to a method for forming patterns of a semiconductor device.

2. Description of the Related Art

Typically, a plurality of fine patterns may be formed during a semiconductor device fabrication process using photolithography. A general photolithography process is limited in how much it can minimize the critical dimension, i.e., the minimum feature size, of the formed patterns. Various techniques have been developed for enhancing the ability of photolithography in minimizing the critical dimension of fine patterns. However, further improvements are required because the high consumer demand for smaller, higher capacity, more reliable electronic devices. Accordingly, there is a need for a technique for realizing the critical dimension exceeding the critical resolution of heretofore photolithography processes.

SUMMARY

Exemplary embodiments of the present invention are directed to an improved method for forming dense fine patterns.

In accordance with an embodiment, a method for forming patterns includes: forming an etch barrier stack in which a first sacrificial material, first mask lines, a second sacrificial material and second mask lines intersecting with the first mask lines are sequentially disposed on an etch target material; etching the second sacrificial material and the first sacrificial material using the second and first mask lines as etch masks, to form island-shaped sacrificial openings isolated from one another in the first sacrificial material; forming island-shaped sacrificial pillars to fill the island-shaped sacrificial openings; etching the first mask lines to form island-shaped masks at intersections between the first mask lines and the second mask lines; and etching the first sacrificial material using the island-shaped masks and the island-shaped sacrificial pillars as etch masks, to form a sacrificial barrier including island-shaped openings that are isolated from one another and expose the etch target material.

In accordance with an embodiment, a method for forming patterns includes: forming etch target lines isolated from one another over a substrate; forming an etch barrier stack in which a first sacrificial material, first mask lines, a second sacrificial material and second mask lines intersecting with the first mask lines are sequentially disposed on the etch target lines; sequentially etching the second sacrificial material and the first sacrificial material using the second and first mask lines as etch masks, to form island-shaped sacrificial openings isolated from one another in the first sacrificial material; forming island-shaped sacrificial pillars to fill the island-shaped sacrificial openings; etching the first mask lines to form island-shaped masks at intersections between the first mask lines and the second mask lines; etching the first sacrificial material using the island-shaped masks and the island-shaped sacrificial pillars as etch masks, to form a sacrificial barrier including island-shaped openings that are isolated from one another to partially expose the etch target lines; and etching the etch target lines using the sacrificial barrier as an etch mask to form island-shaped patterns isolated from one another and isolation holes by cutting the etch target lines.

These and other features and advantages of the present invention will become apparent to those skilled in the art of the invention from the following detailed description in conjunction with the following drawings.

DETAILED DESCRIPTION

Various examples and embodiments described herein will be described with reference to cross-sectional views, plane views and block diagrams, which are simplified schematic views of the present invention. Thus, the shape of the illustrations may be modified by fabricating techniques and/or tolerances. Accordingly, the embodiments of the present invention are not limited to the specific forms shown, but also may include changes in the shapes that are generated according to the fabricating process. The regions illustrated in the figures have schematic attributes, and the shapes of the regions illustrated in the figures are intended to illustrate specific types of regions of the elements and are not intended to limit the scope of the invention.

FIGS. 1A to 1K are plane views for describing a method for forming patterns in accordance with an embodiment. FIGS. 2A to 12D are cross-sectional views for describing the method for forming patterns in accordance with the embodiment.

Figure 1A:
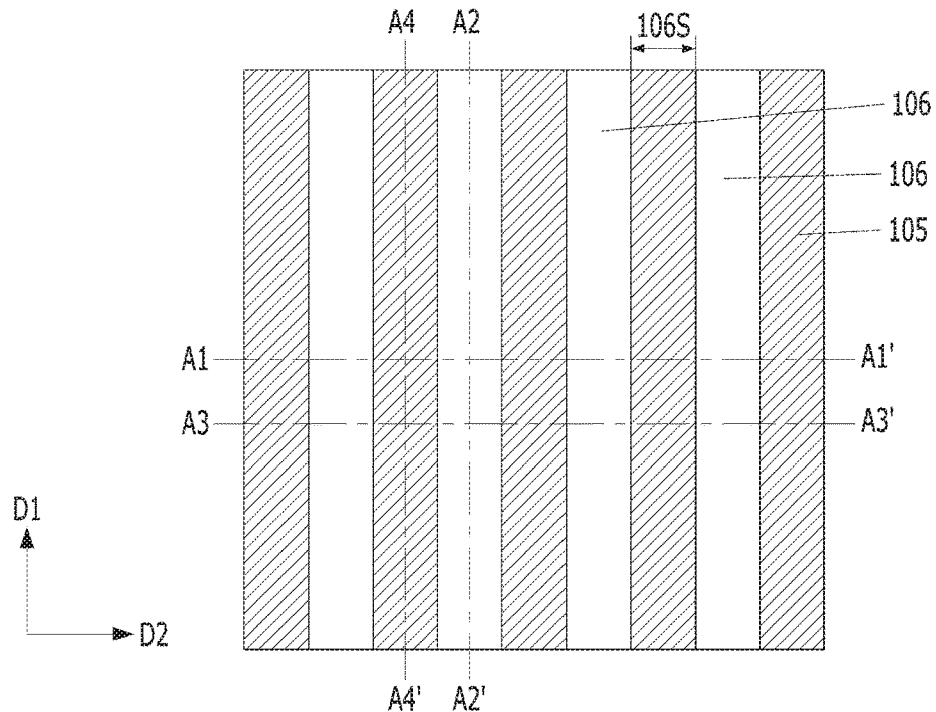
FIGS. 1A to 1K are plane views for describing a method for forming patterns in accordance with an embodiment.
Figure 2A:
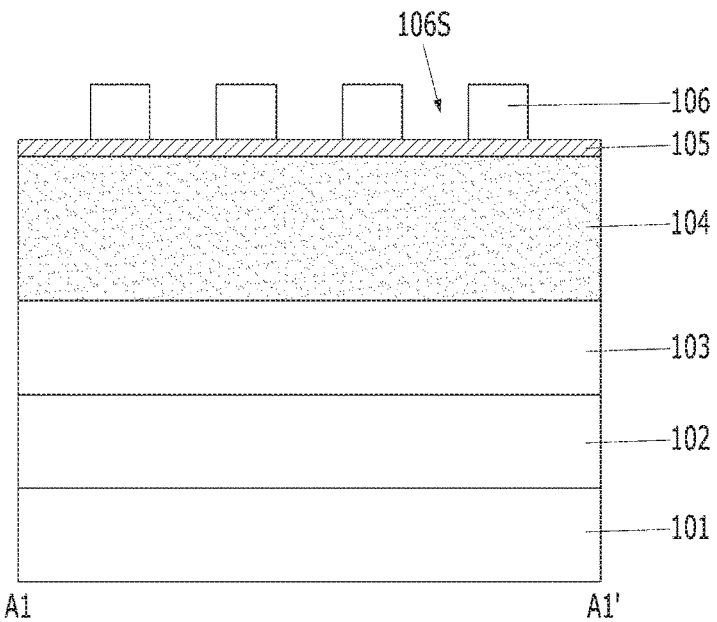
FIGS. 2A to 12D are cross-sectional views for describing a method for forming patterns in accordance with the embodiment.
Figure 2B:
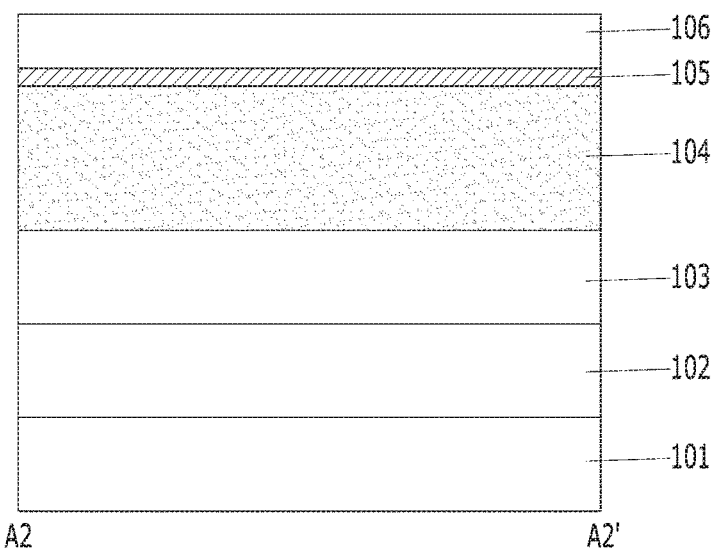
Figure 2C:
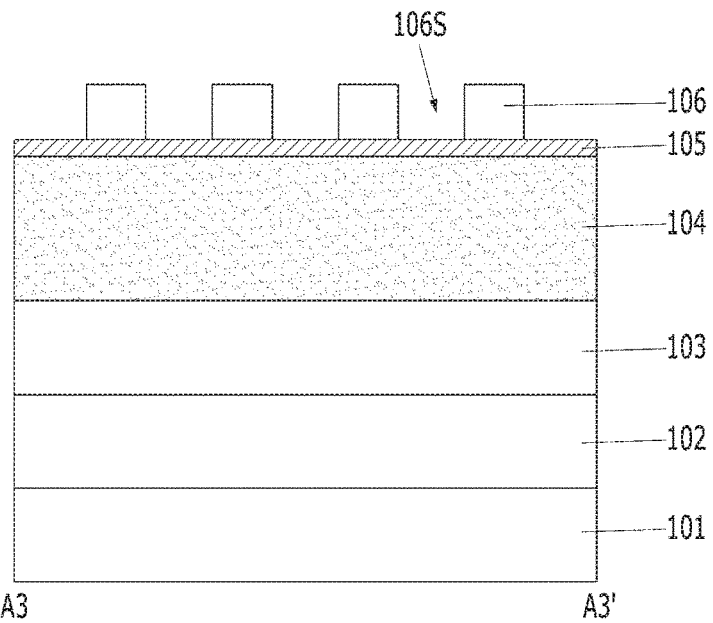
Figure 2D:
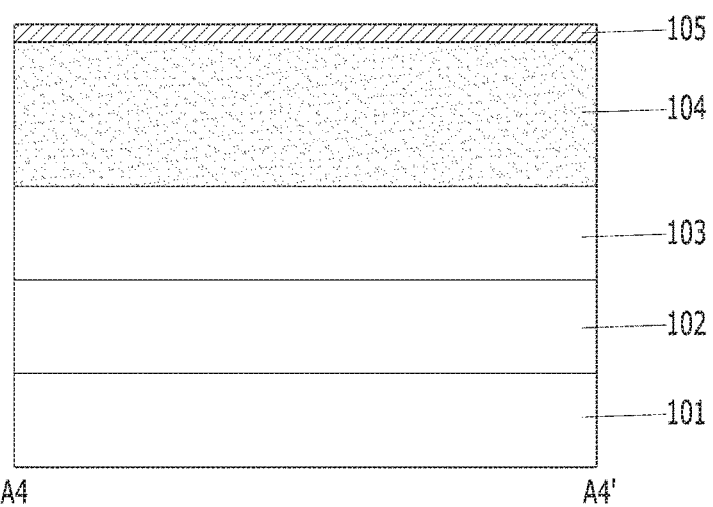

FIG. 2A is a cross-sectional view taken along an A1-A1' line of FIG. 1A. FIG. 2B is a cross-sectional view taken along an A2-A2' line of FIG. 1A. FIG. 2C is a cross-sectional view taken along an A3-A3' line of FIG. 1A. FIG. 2D is a cross-sectional view taken along an A4-A4' line of FIG. 1A.

Referring to FIGS. 1A and 2A to 2D, a lower material 102 may be formed on a substrate 101. The substrate 101 may be a material that is suitable for semiconductor processing. The substrate 101 may include a semiconductor substrate, a dielectric layer, a conductive layer, a semiconductor layer or combinations thereof. The substrate 101 may include a silicon substrate, a silicon germanium substrate, a Silicon-On-Insulator (SOI) substrate or a chemical compound semiconductor substrate. The lower material 102 may be single-layered or multi-layered. The lower material 102 may include a dielectric layer, a conductive layer, a semiconductor layer or combinations thereof. The lower material 102 may include silicon oxide, silicon nitride, polysilicon, a metal or combinations thereof. In the present embodiment, the lower material 102 may be silicon oxide.

An etch target material 103 may be formed on the lower material 102. The etch target material 103 may have an etch selectivity to the lower material 102. The etch target material 103 may be single-layered or multi-layered. The etch target material 103 may include a dielectric layer, a conductive layer, a semiconductor layer or combinations thereof. The etch target material 103 may include silicon oxide, silicon nitride, polysilicon, a metal or combinations thereof. In the present embodiment, the etch target material 103 may be polysilicon.

A first sacrificial material 104 may be formed on the etch target material 103. The first sacrificial material 104 may have an etch selectivity to the etch target material 103. In other words, the first sacrificial material 104 may serve as an etch barrier during an etch process for the etch target material 103. The first sacrificial material 104 may include a nitride, oxide, carbon, an anti-reflection coating layer (ARC), polysilicon, spin-on-carbon (SOC) or combinations thereof. The first sacrificial material 104 may have a multi-layer structure composed of different materials. The first sacrificial material 104 may serve as the etch barrier during the etch process for the etch target material 103. The first sacrificial material 104 may have a planar top surface. The first sacrificial material 104 may be formed by spin-on-coating. The first sacrificial material 104 may be formed of a carbon material, or carbon-containing material. The first sacrificial material 104 may include a carbon material or carbon-containing material (SOC) formed by spin-on-coating. In a preferred embodiment, the first sacrificial material 104 may be made of a carbon material which provides an excellent etch barrier during etching of the polysilicon material of the etch target material 103.

A first mask material 105 may be formed on the first sacrificial material 104. The first mask material 105 and the first sacrificial material 104 may have different etch rates to allow selective etching. The first mask material 105 may include oxynitride. The first mask material 105 may include silicon oxynitride (SiON). The first mask material 105 may have a smaller thickness than the first sacrificial material 104. Preferably, the first mask material 105 may have a thickness which is at least 3 to 5 times smaller than the thickness of the first sacrificial material 104, and, more preferably, the first mask material 105 may have a thickness which is at least 6 times smaller than the thickness of the first sacrificial material 104.

A plurality of first photoresist patterns 106 may be formed on the first mask material 105. The first photoresist patterns 106 may be formed by applying photoresist on the first mask material 105, and then performing exposure and development. The first photoresist patterns 106 may have line/space shapes. The first photoresist patterns 106 may be arranged spaced apart along the second direction D2. The first photoresist patterns 106 may have linear shape extending in a first direction D1. A plurality of first spacings 106S may be defined between the respective first photoresist patterns 106, and a surface of the first mask material 105 may be partially exposed by the first spacings 106S. The first spacings 106S may have a linear shape extending in the first direction D1.

The first photoresist patterns 106 may have the same or different widths in the second direction D2. In the described embodiment the first photoresist patterns 106 may have the same widths in the second direction D2. The first spacings 106S may have the same or different widths in the second direction D2. In the described embodiment the first spacings 106S may have the same width in the second direction D2. The first photoresist patterns 106 and the first spacings 106S may have the same or different width in the second direction D2.

Figure 1B:
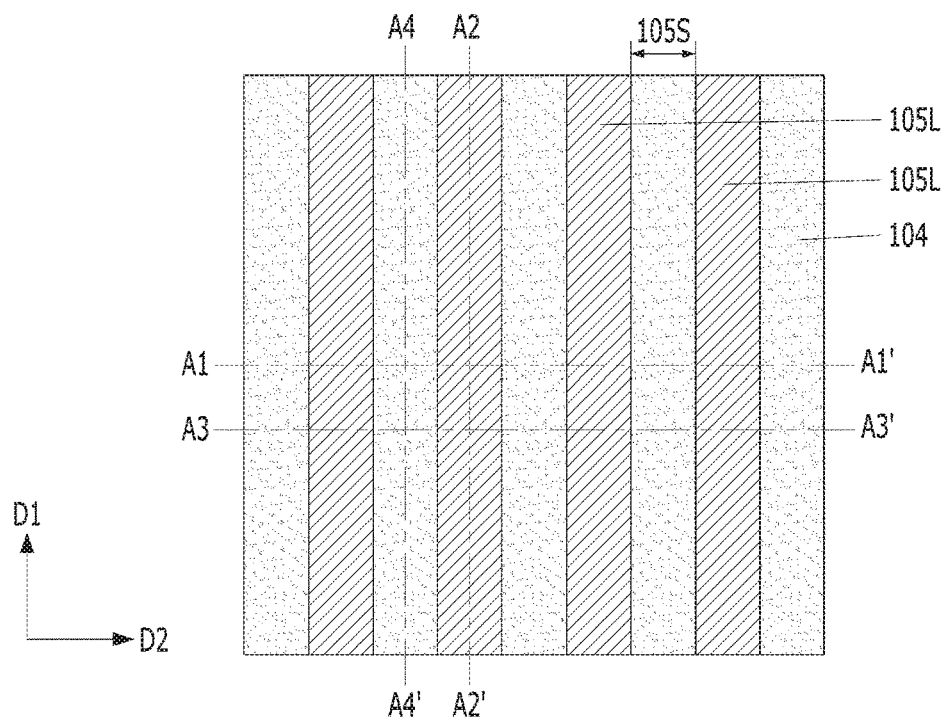
Figure 3A:
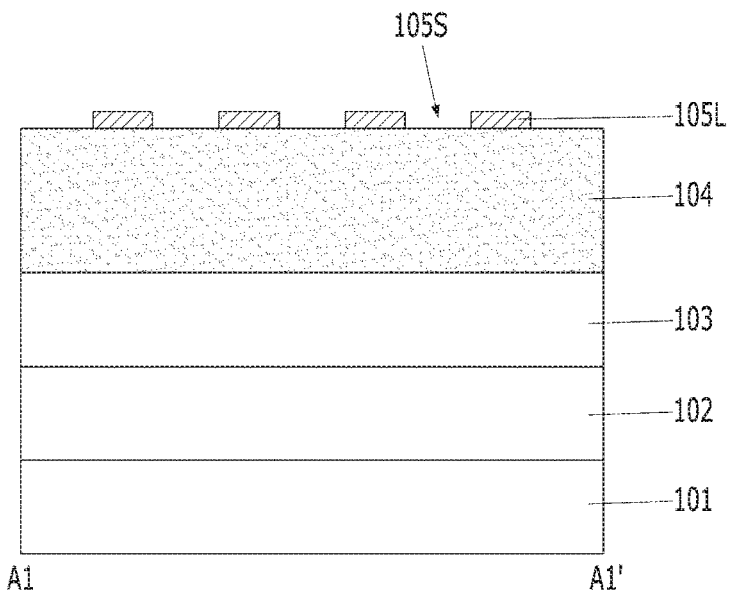
Figure 3B:
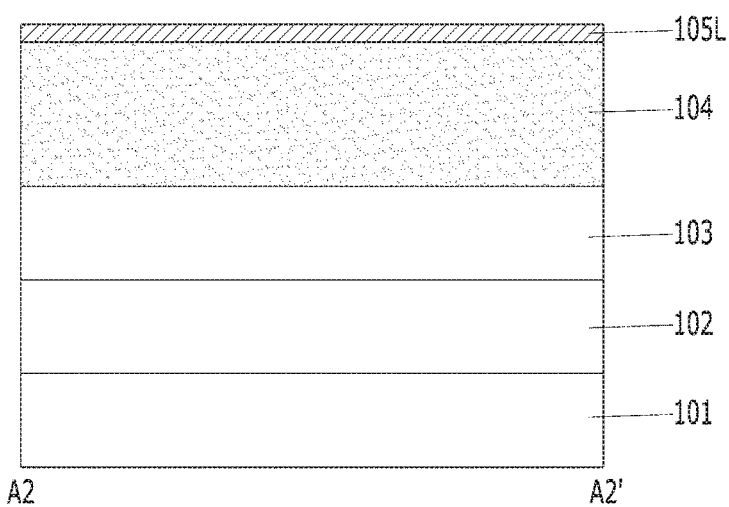
Figure 3C:
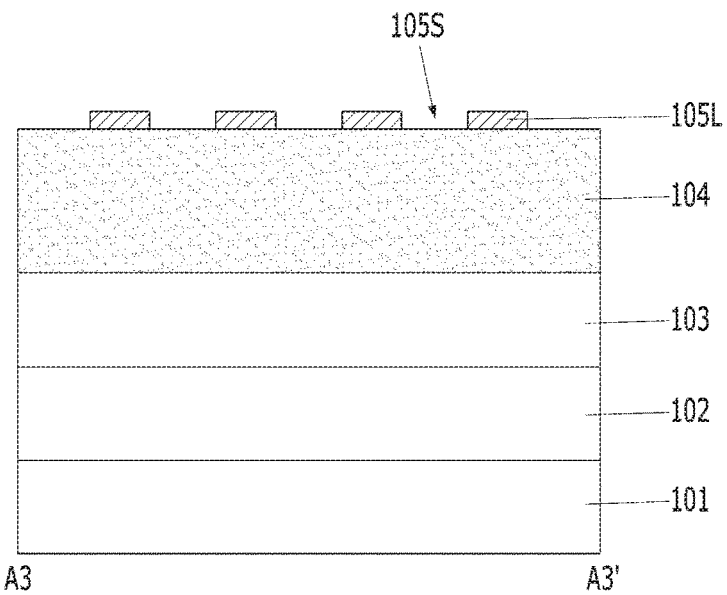
Figure 3D:
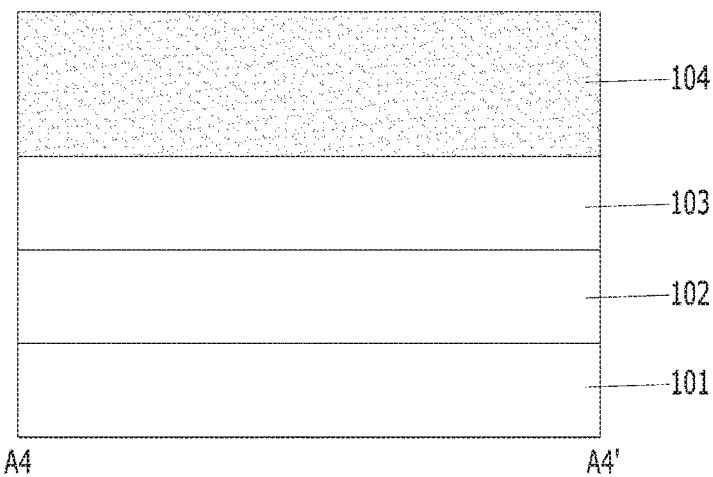

FIG. 3A is a cross-sectional view taken along an A1-A1' line of FIG. 1B. FIG. 313 is a cross-sectional view taken along an A2-A2' line of FIG. 1B. FIG. 3C is a cross-sectional view taken along an A3-A3' line of FIG. 1B. FIG. 3D is a cross-sectional view taken along an A4-A4' line of FIG. 1B.

Referring to FIGS. 1B and 3A to 3D, a plurality of first mask lines 105L may be formed. The first mask lines 105L may be formed by etching the first mask material 105. To form the first mask lines 105L, the first mask material 105 may be etched using the first photoresist patterns 106 as etch barriers.

The first mask lines 105L may have linear shapes extending in the first direction D1. The first mask lines 105L may have line/space shapes. The first mask lines 105L may be arranged spaced apart along the second direction D2. A plurality of first line spacings 105S may be defined between the respective first mask lines 105L, and a surface of the first sacrificial material 104 may be partially exposed by the first line spacings 105S. The first mask lines 105L may have the same or different widths in the second direction D2. In the described embodiment the first mask lines 105L may have the same widths in the second direction D2. The first line spacings 105S may have the same or different widths in the second direction D2. In the described embodiment the first line spacings 105S may have the same width in the second direction D2. The first mask lines 105L and the first line spacings 105S may have the same or different width in the second direction D2.

After the first mask lines 105L are formed, the first photoresist patterns 106 may be removed. For example, the first photoresist patterns 106 may be removed by a photoresist strip process.

In some embodiments, during an etch process for forming the first mask lines 105L, the top of the first sacrificial material 104 may be partially etched.

Figure 1C:
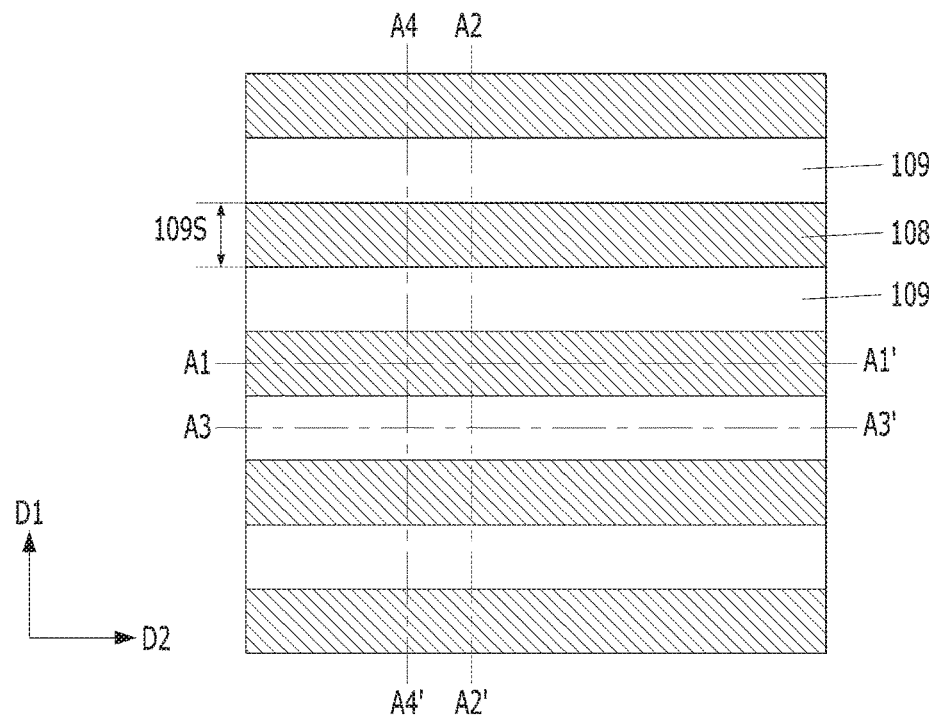
Figure 4A:
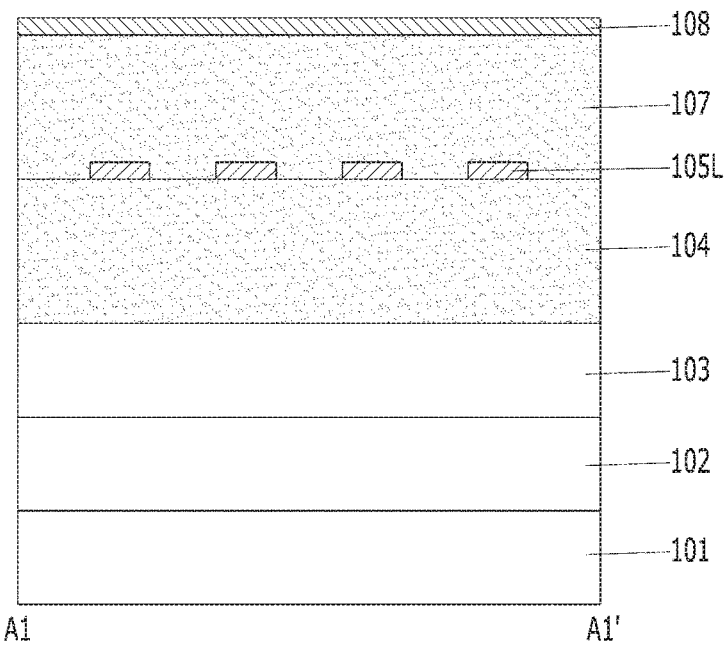
Figure 4B:
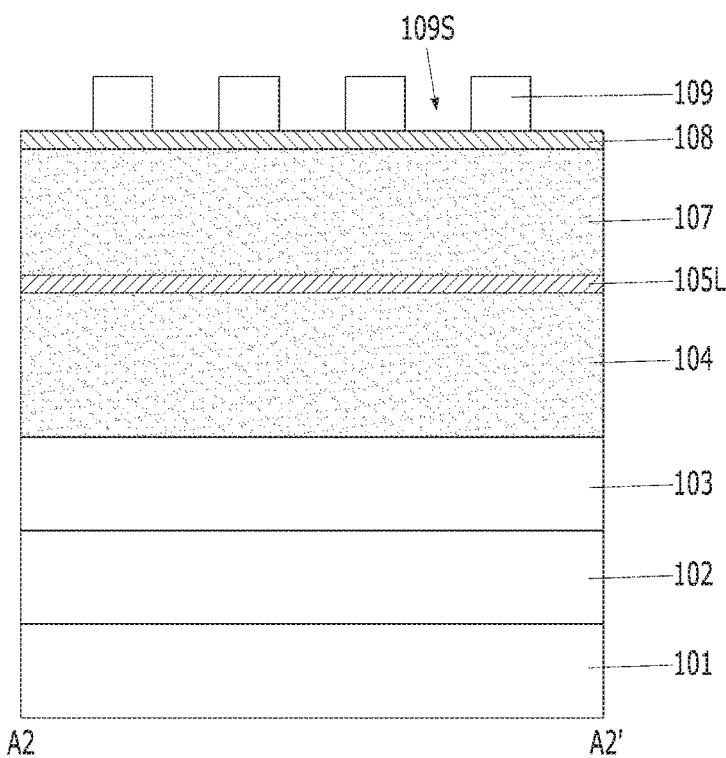
Figure 4C:
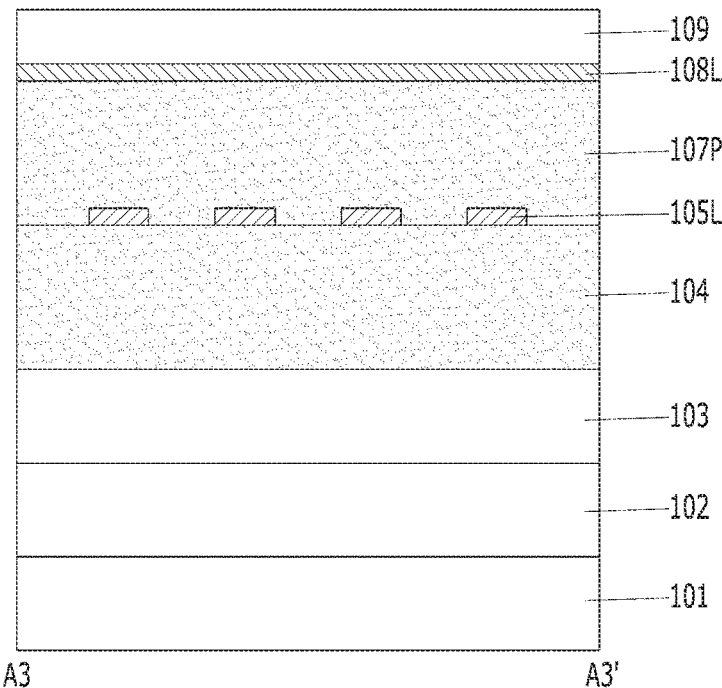
Figure 4D:
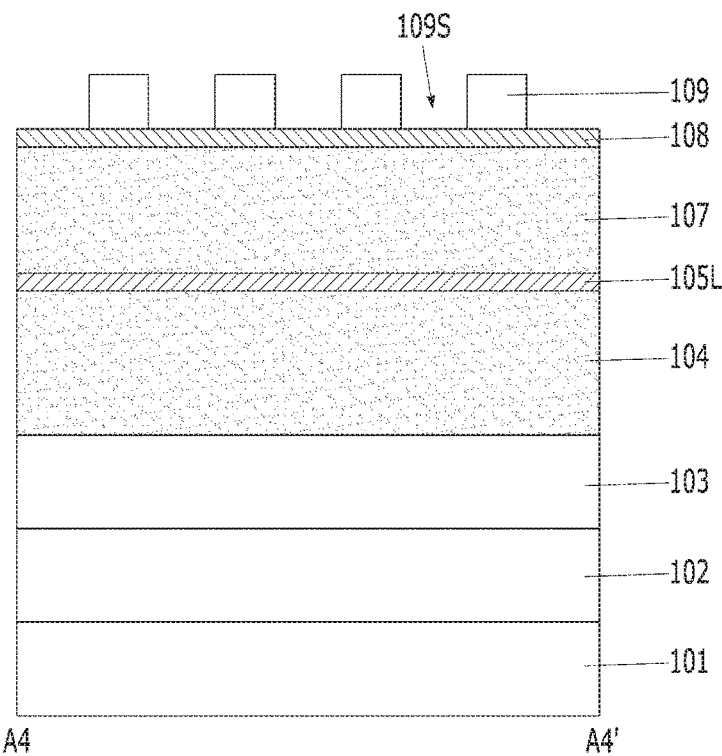

FIG. 4A is a cross-sectional view taken along an A1-A1' line of FIG. 1C. FIG. 4B is a cross-sectional view taken along an A2-A2' line of FIG. 1C. FIG. 4C is a cross-sectional view taken along an A3-A3' line of FIG. 1C. FIG. 4D is a cross-sectional view taken along an A4-A4' line of FIG. 1C.

Referring to FIGS. 1C and 4A to 4D, a second sacrificial material 107 may be formed on the first mask lines 105L. The second sacrificial material 107 may fill the first line spacings 105S between the first mask lines 105L without a void. The second sacrificial material 107 may have a planar top surface. The second sacrificial material 107 and the first sacrificial material 104 may be the same material. The second sacrificial material 107 may be formed by spin-on-coating. The second sacrificial material 107 may be formed of a carbon material or carbon-containing material. The second sacrificial material 107 may include spin-on-carbon (SOC).

A second mask material 108 may be formed on the second sacrificial material 107. The second mask material 108 and the first mask lines 105L may be formed of the same material. The second mask material 108 may serve as an etch barrier during the etching of the second sacrificial material 107. The second mask material 108 may include oxynitride. The second mask material 108 may include silicon oxynitride (SiON). The second mask material 108 may have a smaller thickness than the second sacrificial material 107.

Second photoresist patterns 109 may be formed on the second mask material 108. The second photoresist patterns 109 may be formed by applying photoresist on the second mask material 108, and then performing exposure and development. The second photoresist patterns 109 may have line/space shapes. The second photoresist patterns 109 may be arranged spaced apart along the first direction D1. The second photoresist patterns 109 may have linear shapes extending in a second direction D2. A plurality of second spacings 109S may be defined between the respective second photoresist patterns 109, and a surface of the second mask material 108 may be partially exposed by the second spacings 109S. The second spacing 109S may have a linear shape extending in the second direction D2. The second photoresist patterns 109 may intersect with the first mask lines 105L. For example, the second photoresist patterns 109 and the first mask lines 105L may intersect perpendicular to each other.

Figure 1D:
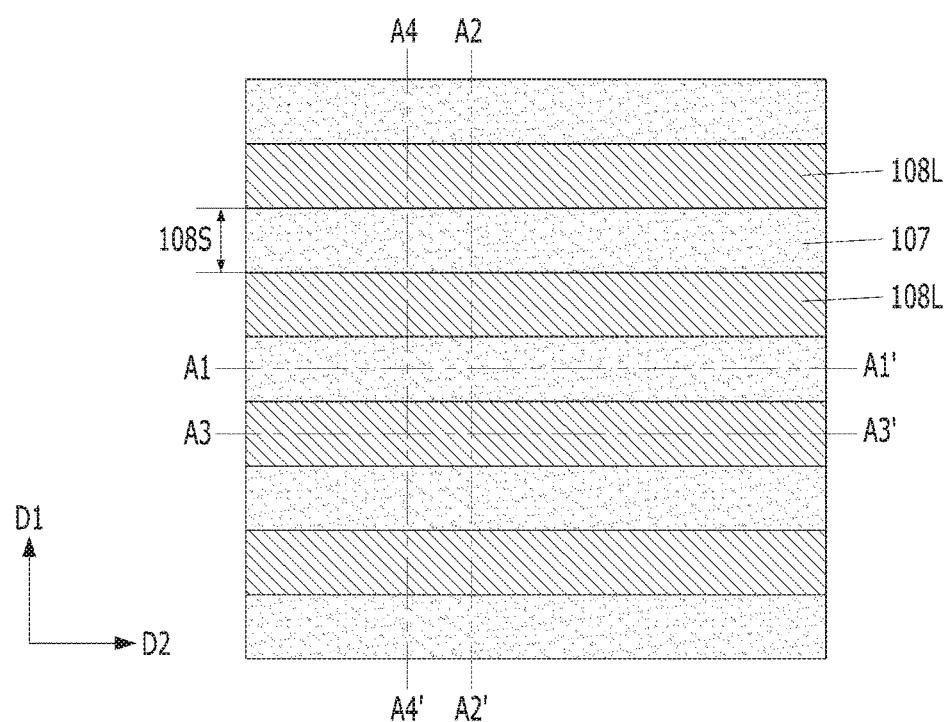
Figure 5A:
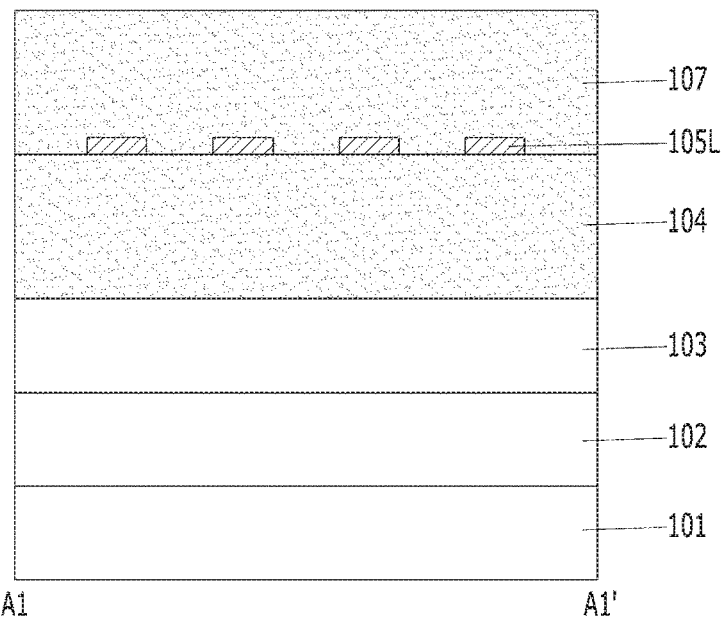
Figure 5B:
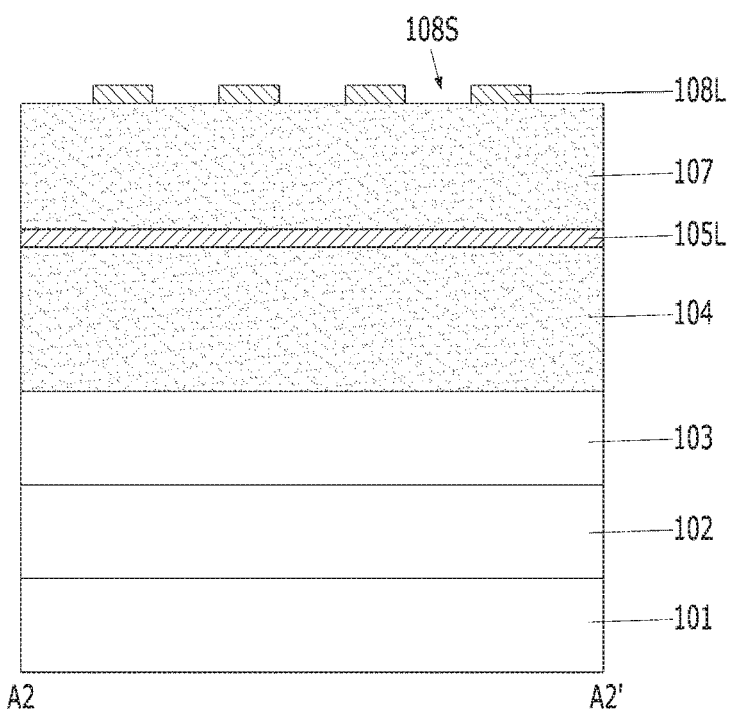
Figure 5C:
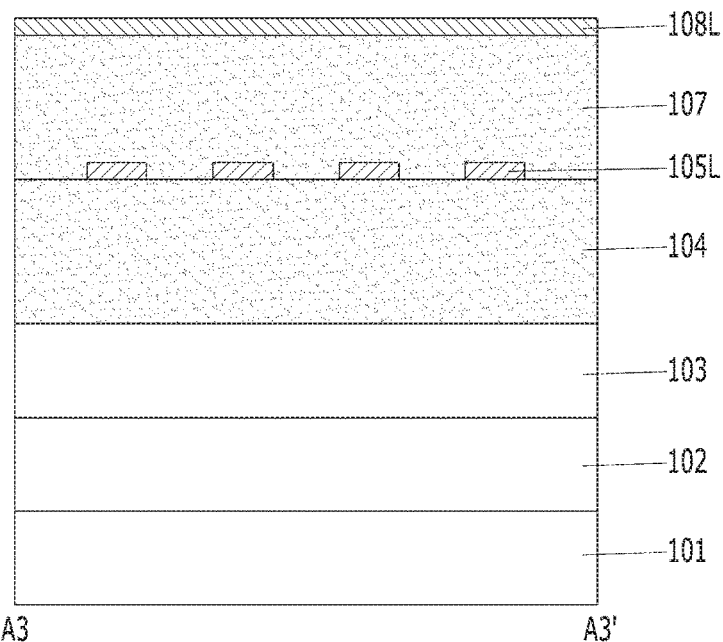
Figure 5D:
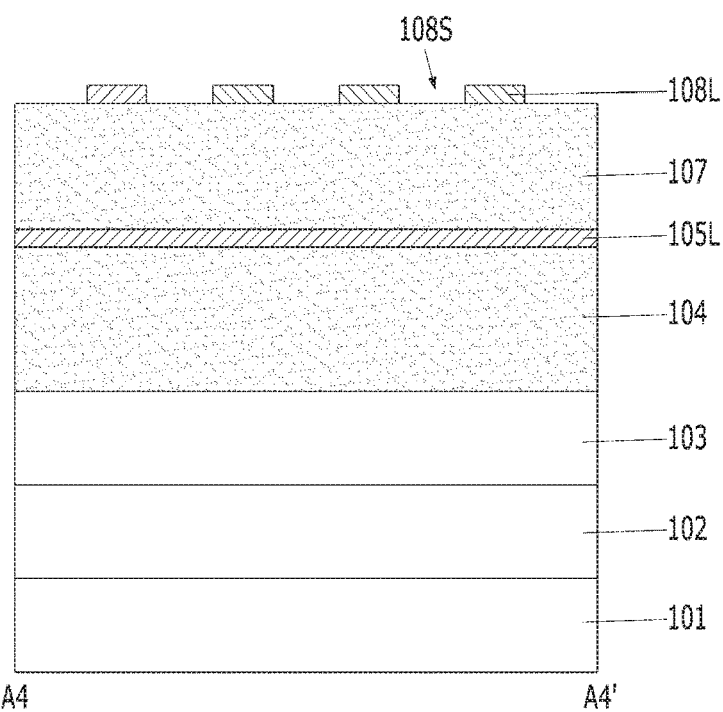

FIG. 5A is a cross-sectional view taken along an A1-A1' line of FIG. 1D. FIG. 5B is a cross-sectional view taken along an A2-A2' line of FIG. 1D. FIG. 5C is a cross-sectional view taken along an A3-A3' line of FIG. 1D. FIG. 5D is a cross-sectional view taken along an A4-A4' line of FIG. 1D.

Referring to FIGS. 1D and 5A to 5D, a plurality of second mask lines 108L may be formed. The second mask lines 108L may be formed by etching the second mask material 108. To form the second mask lines 108L, the second mask material 108 may be etched using the second photoresist patterns 109 as etch barriers.

The second mask lines 108L may have linear shapes extending in the second direction D2. The second mask lines 108L and the first mask lines 105L may intersect. For example, the second mask lines 108L and the first mask lines 105L may intersect perpendicular to each other. A plurality of second line spacings 108S may be defined between the respective second mask lines 108L, and a surface of the second sacrificial material 107 may be partially exposed by the second line spacings 108S.

From the perspective of a top view, the second mask lines 108L and the first mask lines 105L may intersect perpendicular to each other.

A stack structure of the first sacrificial material 104, the first mask lines 105L, the second sacrificial material 107 and the second mask lines 108L may be referred to as an etch barrier stack for etching the etch target material 103. The second sacrificial material 107 may be positioned between the first mask lines 105L and the second mask lines 108L, and the first sacrificial material 104 may be positioned between the first mask lines 105L and the etch target material 103.

In some embodiments, during an etch process for forming the second mask lines 108L, the top of the second sacrificial material 107 may be partially etched.

Figure 1E:
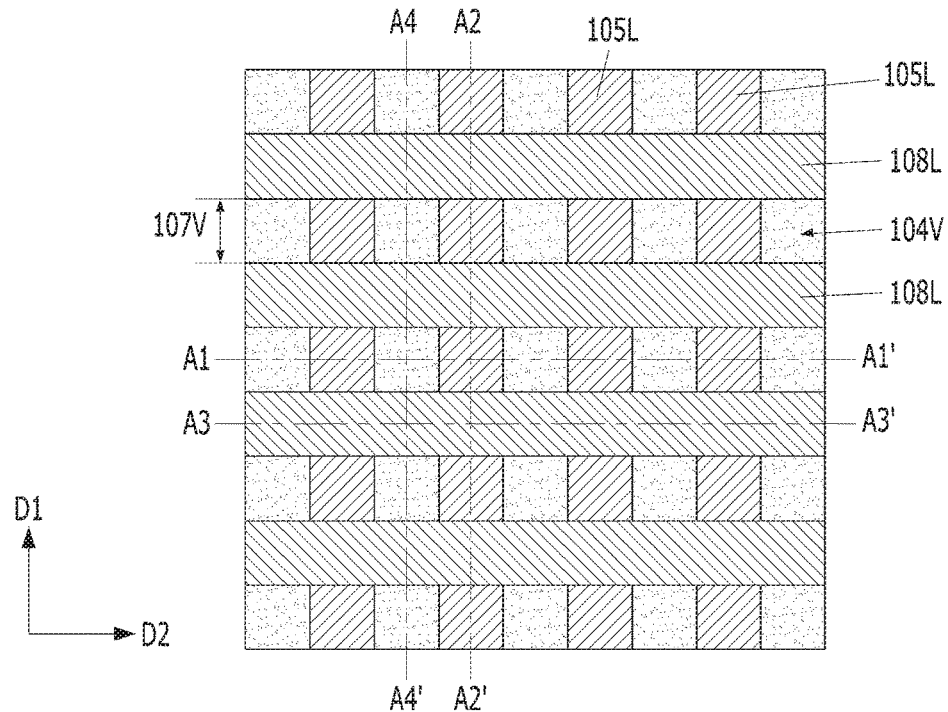
Figure 6A:
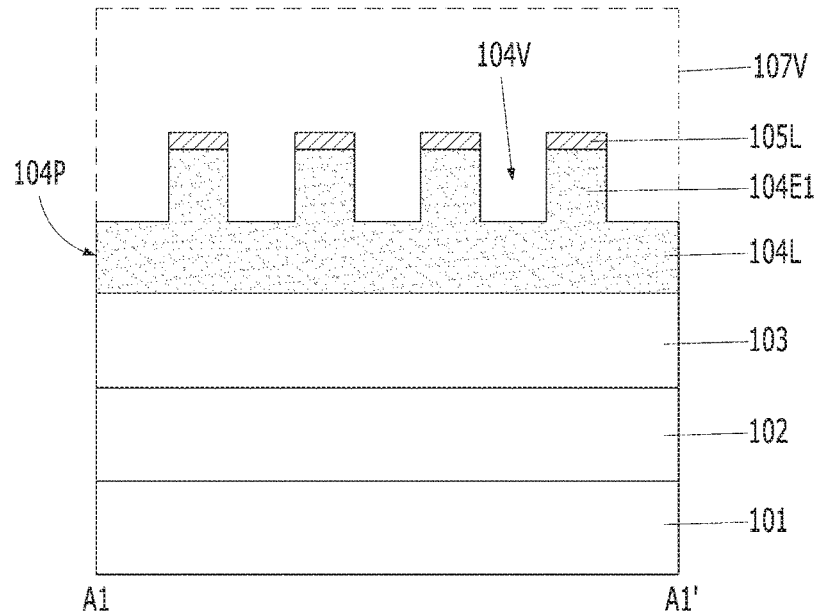
Figure 6B:
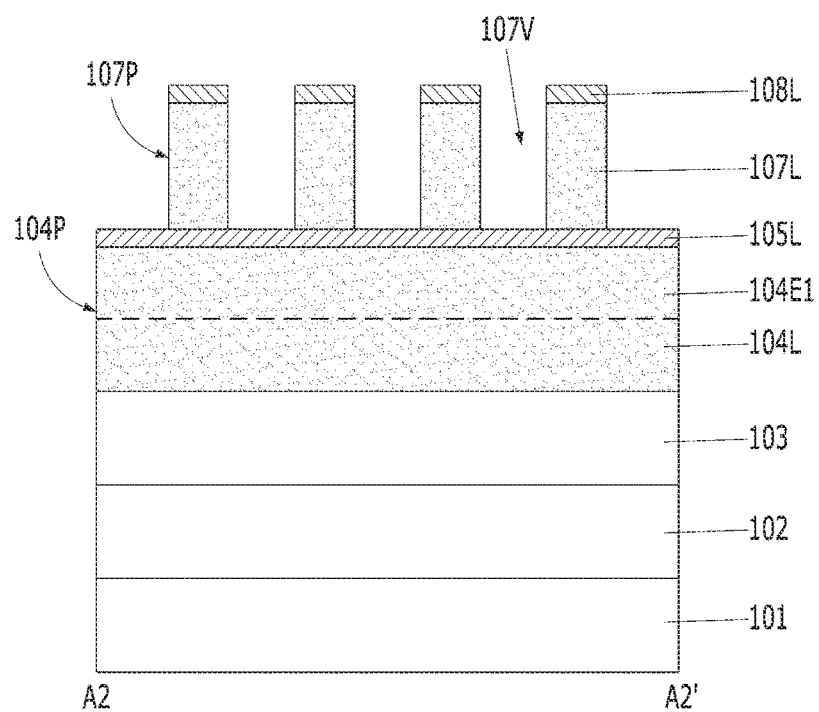
Figure 6C:
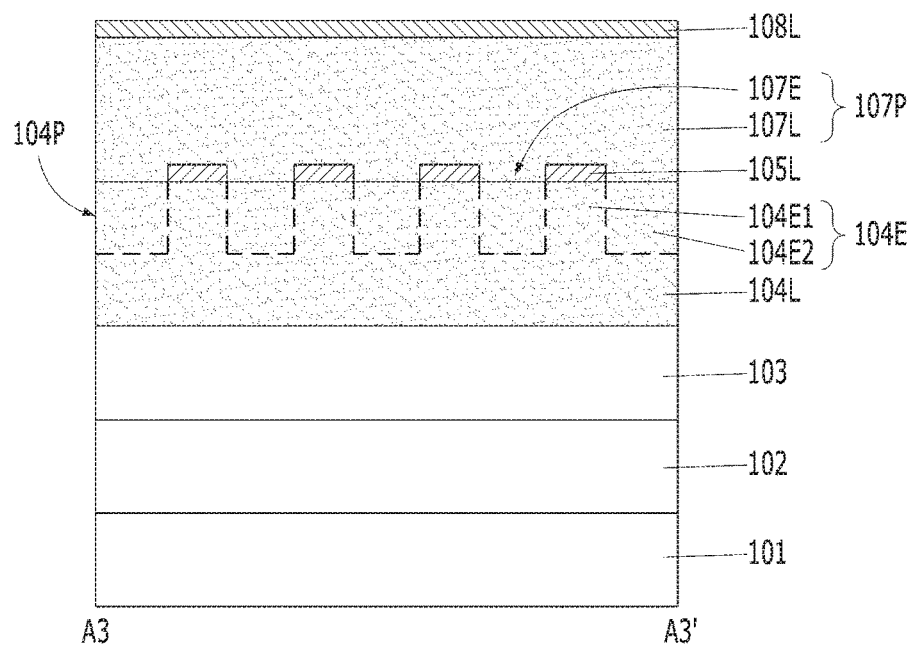
Figure 6D:
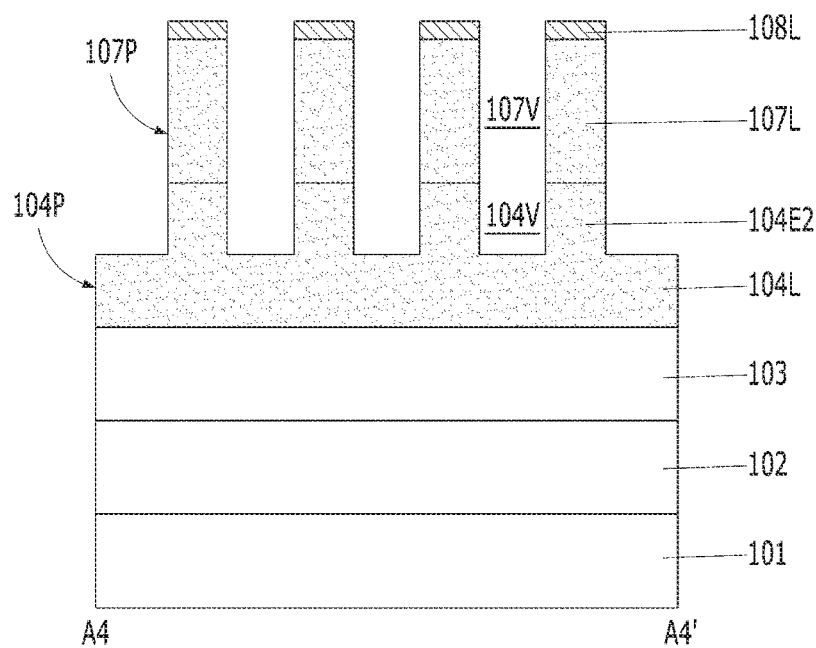

FIG. 6A is a cross-sectional view taken along an A1-A1' line of FIG. 1E. FIG. 6B is a cross-sectional view taken along an A2-A2' line of FIG. 1E. FIG. 6C is a cross-sectional view taken along an A3-A3' line of FIG. 1E. FIG. 6D is a cross-sectional view taken along an A4-A4' line of FIG. 1E.

Referring to FIGS. 1E and 6A to 6D, a plurality of upper sacrificial pattern 107P may be formed. To form the upper sacrificial patterns 107P, the second sacrificial material 107 may be etched using the second mask lines 108L as etch barriers. As the upper sacrificial patterns 107P are formed, a plurality of upper openings 107V may be defined between the respective upper sacrificial pattern 107P. Bottom surfaces of the upper sacrificial patterns 107P may be positioned at the same level as the first mask lines 105L. For example, the second sacrificial material 107 between the first mask lines 105L may also be etched in order to define the upper openings 107V.

Each of the upper sacrificial patterns 107P may include an upper body portion 107L and a plurality of downwardly protruding portions 107E. The downwardly protruding portions 107E may each extend downwardly from the upper body portion 107L. The downwardly protruding portions 107E may be arranged in a spaced apart relationship from each other and positioned between the respective first mask lines 105L. The bottom of each of the upper openings 107V may be positioned between the downwardly protruding portions 107E.

Subsequently, the first sacrificial material 104 exposed to the upper openings 107V may be partially etched to form a lower sacrificial pattern 104P. The first sacrificial material 104 may be partially etched differently from the second sacrificial material 107 that is fully etched until the first sacrificial material 104 is exposed. The first sacrificial material 104 is only partially etched so that the etch target material 103 is not exposed.

The lower sacrificial pattern 104P may include a lower body portion 104L and an upwardly protruding portion 104E. The lower body portion 104L may be positioned on the etch target material 103, and the upwardly protruding portion 104E may upwardly extend in a vertical direction from the lower body portion 104L. The upwardly protruding portion 104E may have a mesh structure as a whole. The upwardly protruding portion 104E may be divided into a plurality of first protruding portions 104E1 and second protruding portions 104E2 between the first protruding portions 104E1. The first protruding portions 104E1 may have linear shapes extending in the first direction D1. The first protruding portions 104E1 may have the same shapes as the first mask lines 105L. The first mask lines 105L may be positioned on the first protruding portions 104E1, and the downwardly protruding portions 107E may be positioned on the second protruding portions 104E2. The second protruding portions 140E2 of the upwardly protruding portion 104E and the downwardly protruding portions 107E may be vertically positioned to contact each other.

The upwardly protruding portions 104E may define a plurality of lower openings 104V. The lower openings 104V may be defined in spaces where the first protruding portions 104E1 and second protruding portions 104E2 do not intersect. The lower openings 104V may be rectangular holes. The lower openings 104V and the upper openings 107V may be vertically continuous to each other.

As described above, the upper openings 107V and the lower openings 104V may be formed by partially etching the upper or second sacrificial material 107 and the lower sacrificial material 104, using the first mask lines 105L and the second mask lines 108L as etch barriers. The lower openings 104V may be formed in the lower sacrificial pattern 104P, and formed by etching portions of the lower sacrificial material 104, corresponding to empty spaces defined at the intersections between the first mask lines 105L and the second mask lines 108L.

Figure 1F:
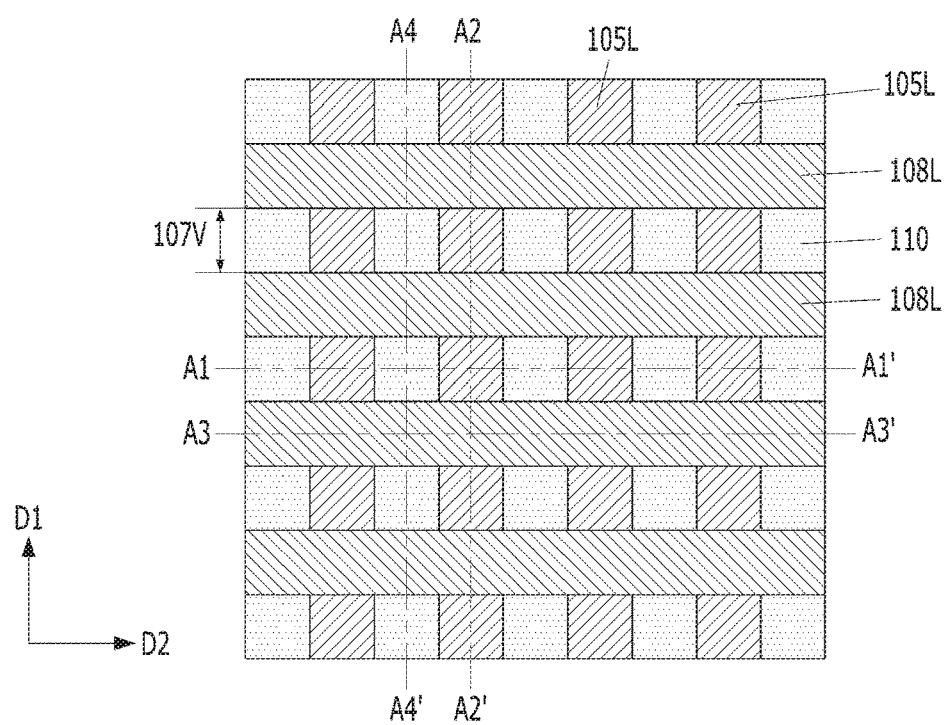
Figure 7A:
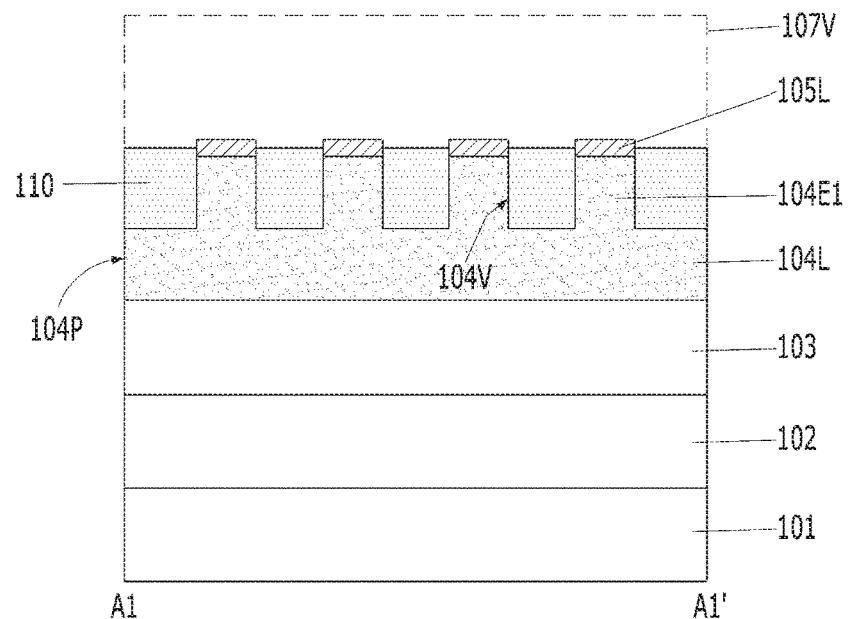
Figure 7B:
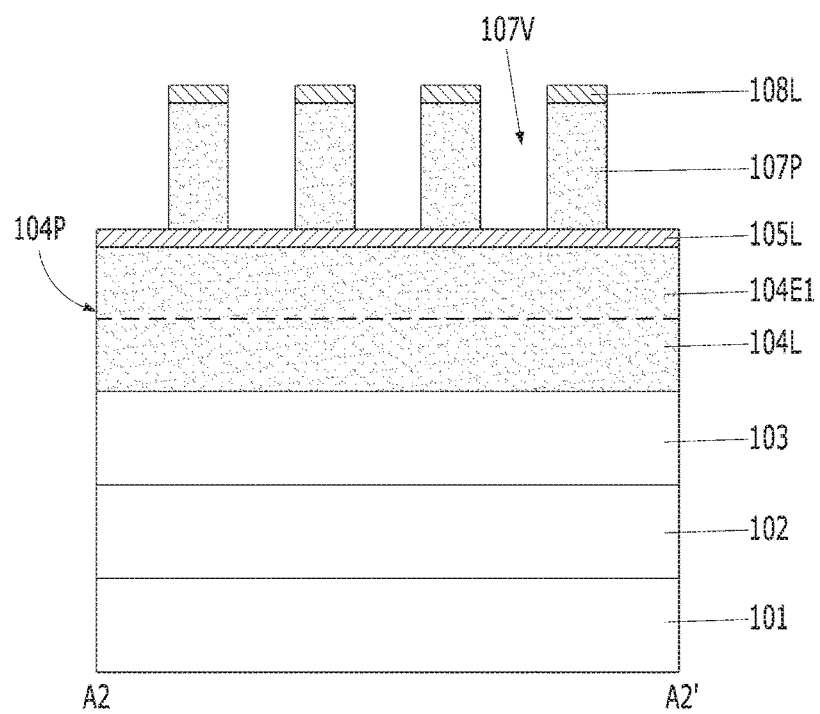
Figure 7C:
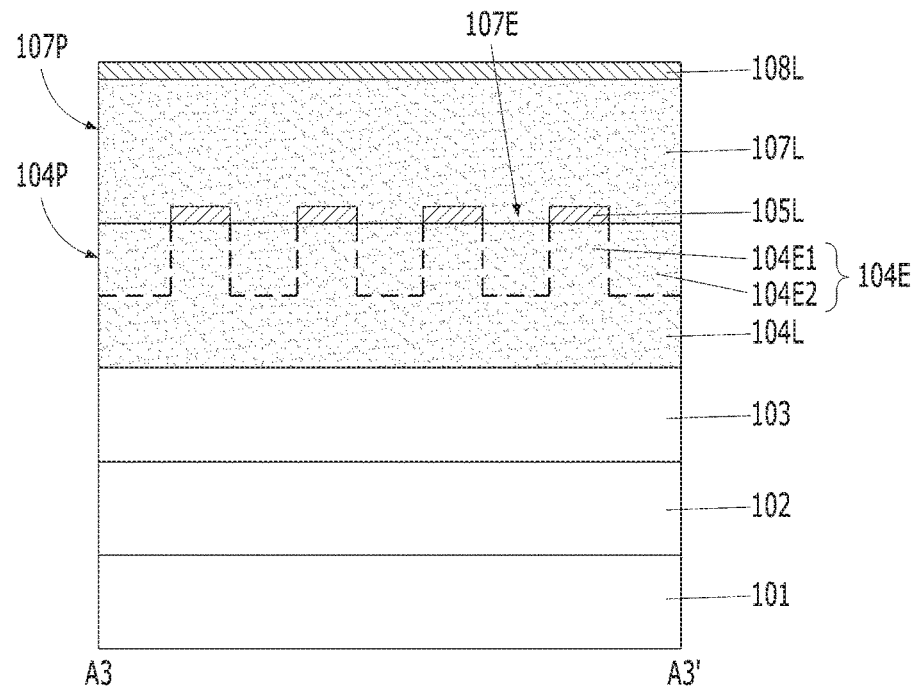
Figure 7D:
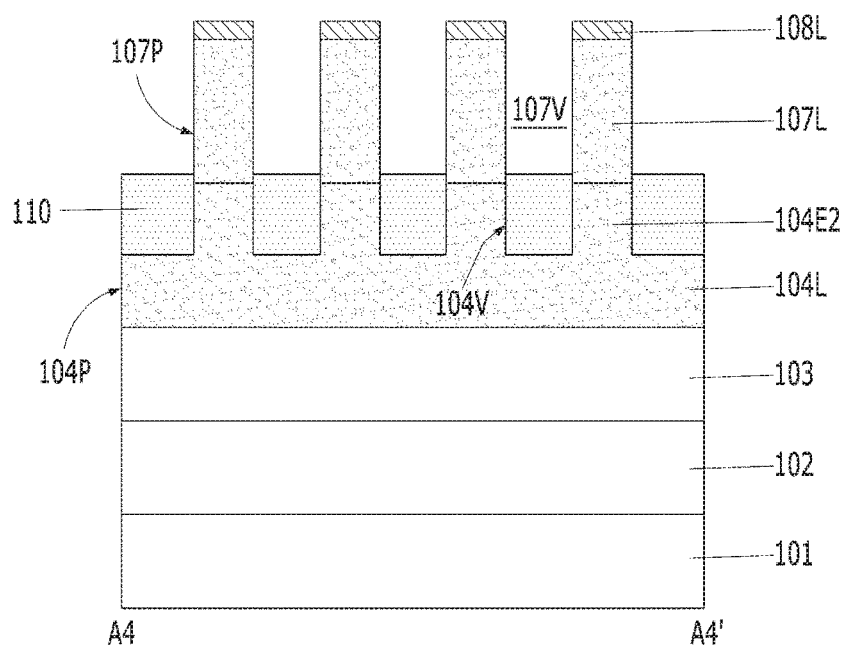

FIG. 7A is a cross-sectional view taken along an A1-A1' line of FIG. 1F. FIG. 7B is a cross-sectional view taken along an A2-A2' line of FIG. 1F. FIG. 7C is a cross-sectional view taken along an A3-A3' line of FIG. 1F. FIG. 7D is a cross-sectional view taken along an A4-A4' line of FIG. 1F.

Referring to FIGS. 1F and 7A to 7D, the lower openings 104V may be filled with sacrificial pillars 110, respectively. To form the sacrificial pillars 110, an etch-back process may be performed after a sacrificial material is deposited on the entire surface of the structure of FIGS. 6A-6D which includes the lower openings 104V and the upper openings 107V. The etch-back process may be performed on the deposited sacrificial material until top surfaces of the first mask lines 105L are exposed. The sacrificial pillars 110 may be made of a different material than the lower sacrificial pattern 104P and the upper sacrificial patterns 107P. The sacrificial pillars 110 may have an etch selectivity to the lower sacrificial pattern 104P and the upper sacrificial patterns 107P. In addition, the sacrificial pillars 110 may have an etch selectivity to the first mask lines 105L and the second mask lines 108L so that they can be selectively etched while the first mask and second mask lines 105L and 108L serve as etch barriers. The sacrificial pillars 110 may be formed of the same material as the etch target material 103. Top surfaces of the sacrificial pillars 110 may be positioned at a lower level than the level of the top surfaces of the first mask lines 105L. The sacrificial pillars 110 may have a shape of filling the respective spaces between the upwardly protruding portion 104E of the lower sacrificial pattern 104P. The sacrificial pillars 110 may have a shape of filling the respective spaces between the first protruding portions 104E1 and the second protruding portions 104E2 of the upwardly protruding portion 104E. The top surfaces of the sacrificial pillars 110 may be positioned at a same level which may be a higher level than the level of the top surfaces of the first protruding portions 104E1 and the second protruding portions 104E2 of the upwardly protruding portion 104E.

Figure 1G:
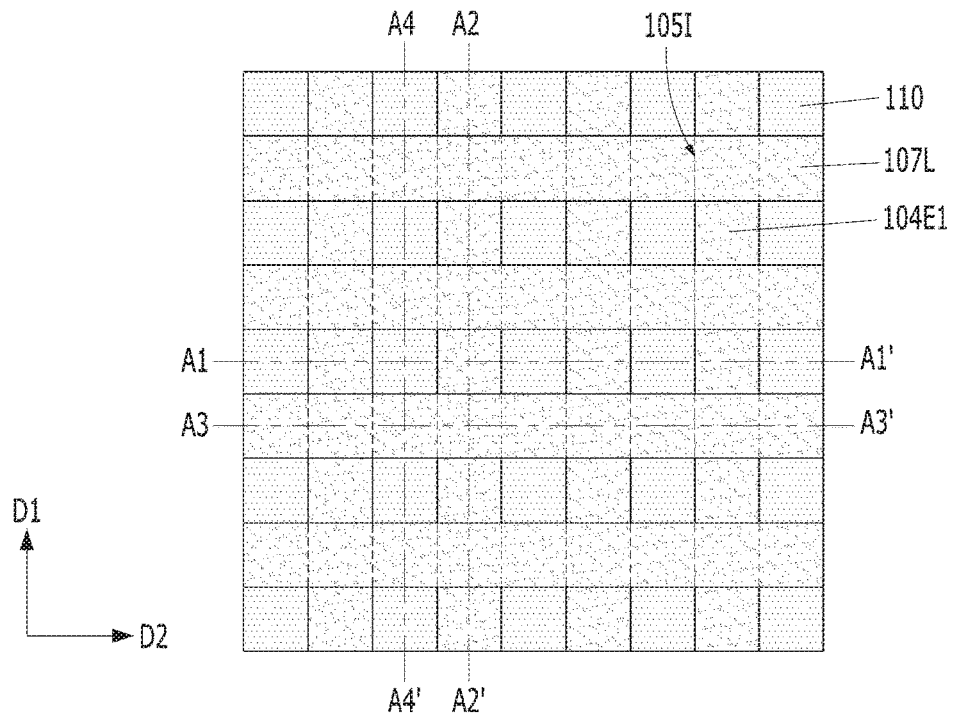
Figure 8A:
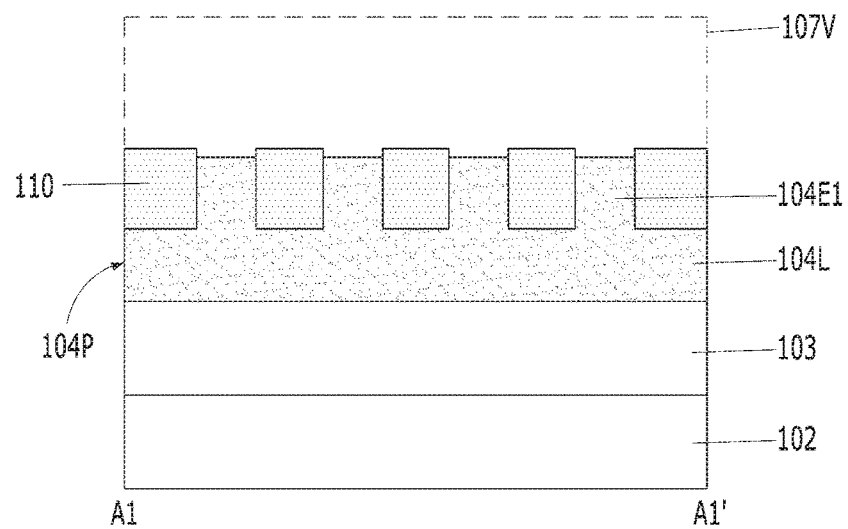
Figure 8B:
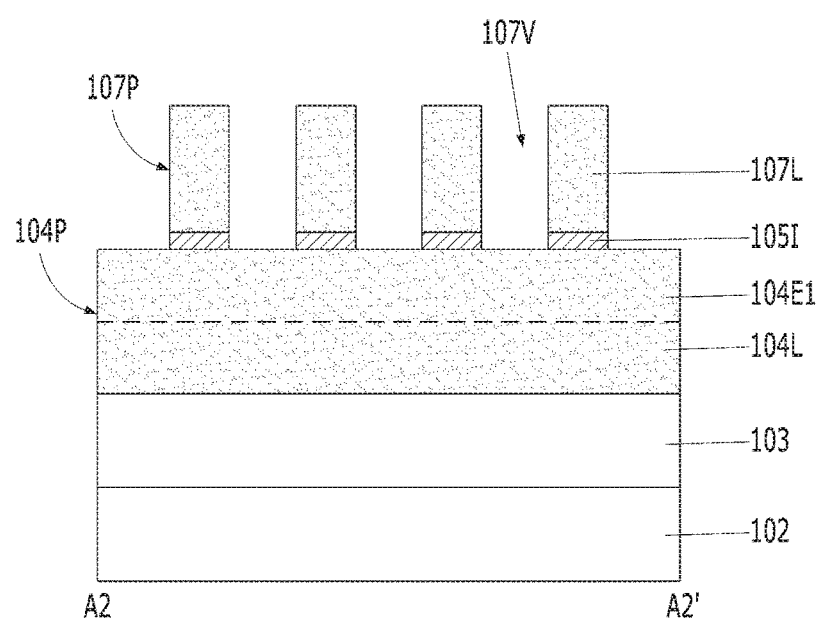
Figure 8C:
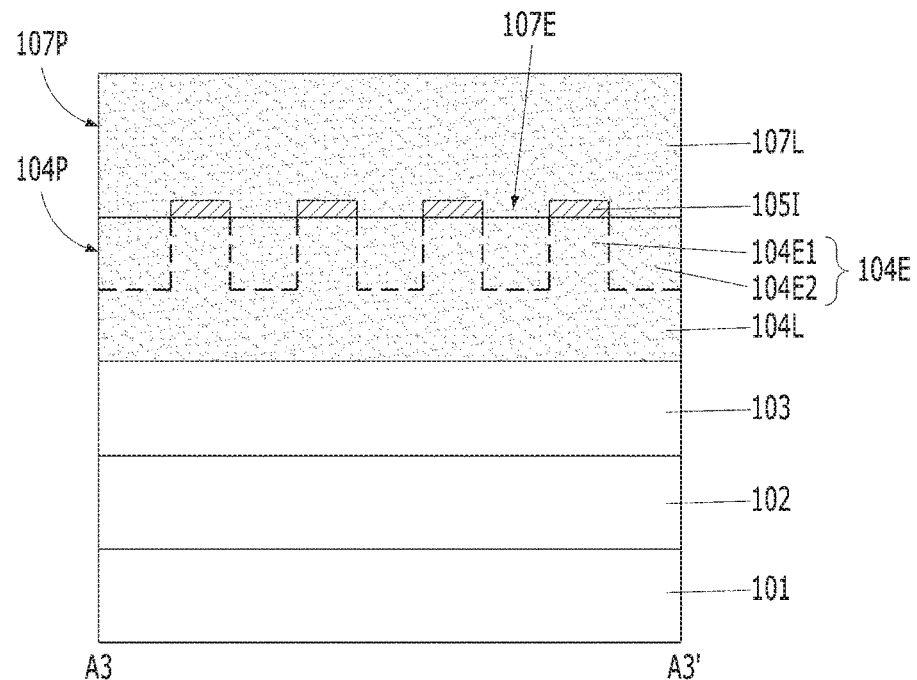
Figure 8D:
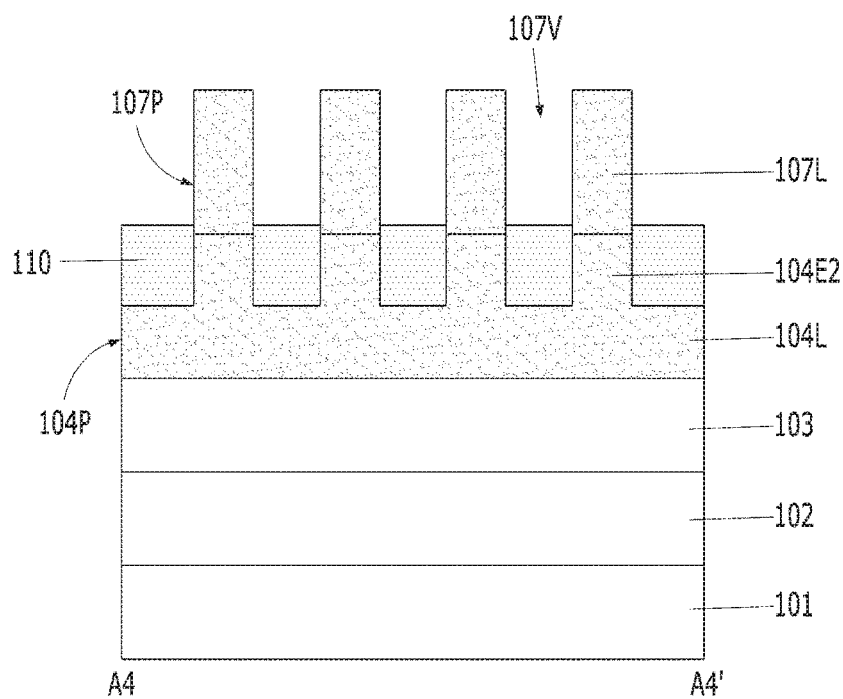

FIG. 8A is a cross-sectional view taken along an A1-A1' line of FIG. 1G. FIG. 8B is a cross-sectional view taken along an A2-A2' line of FIG. 1G. FIG. 8C is a cross-sectional view taken along an A3-A3' line of FIG. 1G. FIG. 8D is a cross-sectional view taken along an A4-A4' line of FIG. 1G.

Referring to FIGS. 1G and 8A to 8D, the second mask lines 108L may be removed. Exposed portions of the first mask lines 105L may be removed simultaneously while the second mask lines 108L are removed. The first mask lines 105L may remain only below the upper sacrificial patterns 107P. In other words, the first mask lines 105L may remain at the intersections between the upper body portions 107L of the upper sacrificial patterns 107P and the first protruding portions 104E1 of the lower pattern 104P. The remaining first mask lines are denoted by the reference numeral '105I'.

The remaining first mask lines 105I may not remain in continuous line shapes but remain in discontinuous shapes. In other words, the remaining first mask lines 105I may have island shapes. Hereinafter, the remaining first mask lines 105I may also be referred to as "island-shaped masks 105I".

Figure 1H:
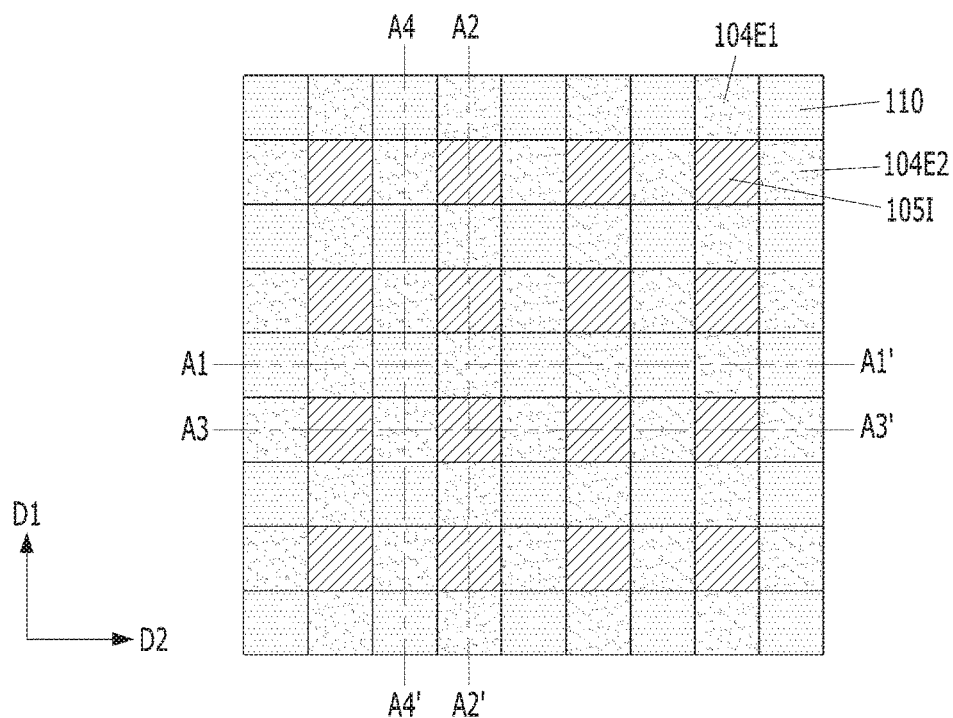
Figure 9A:
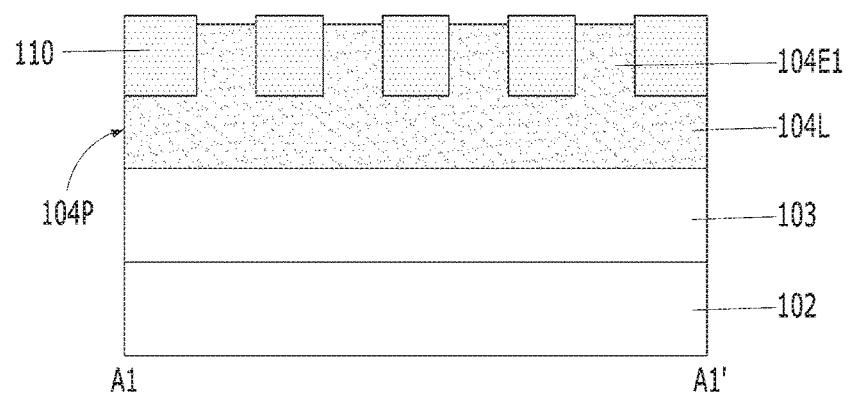
Figure 9B:
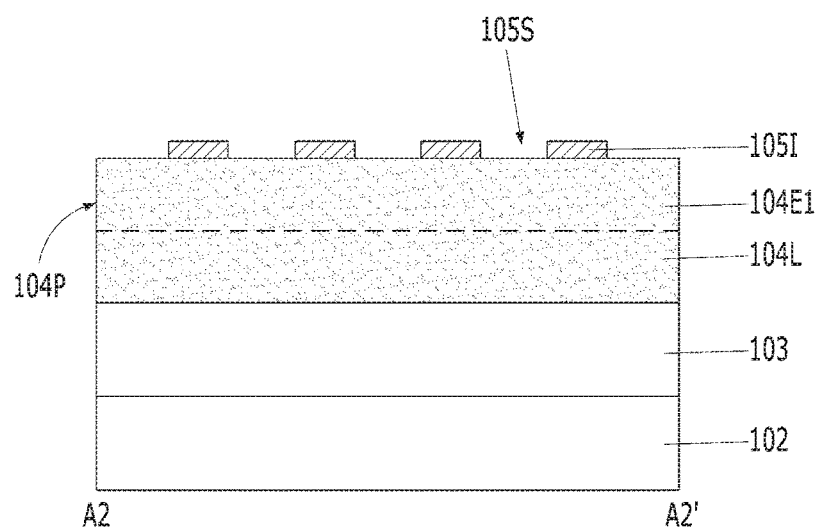
Figure 9C:
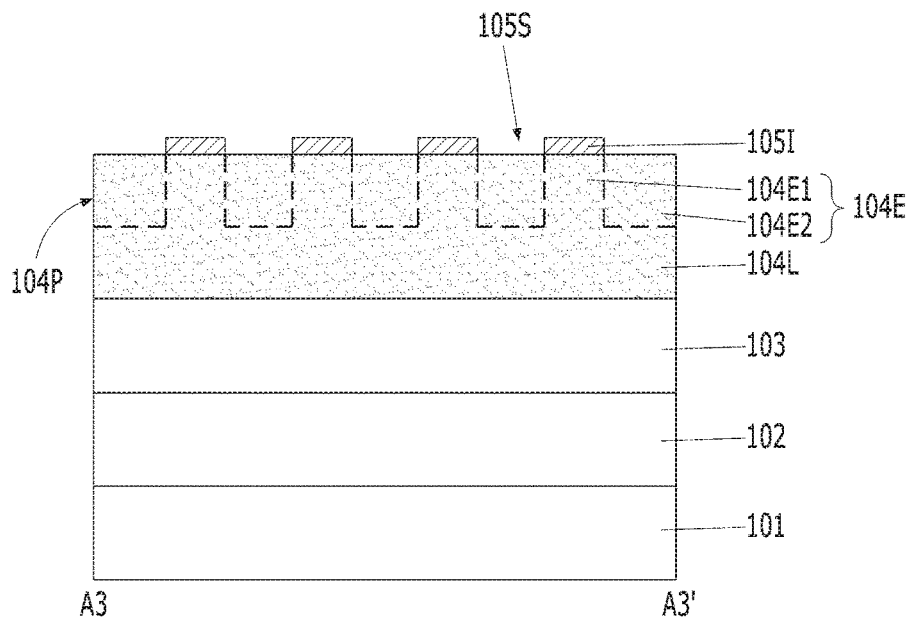
Figure 9D:
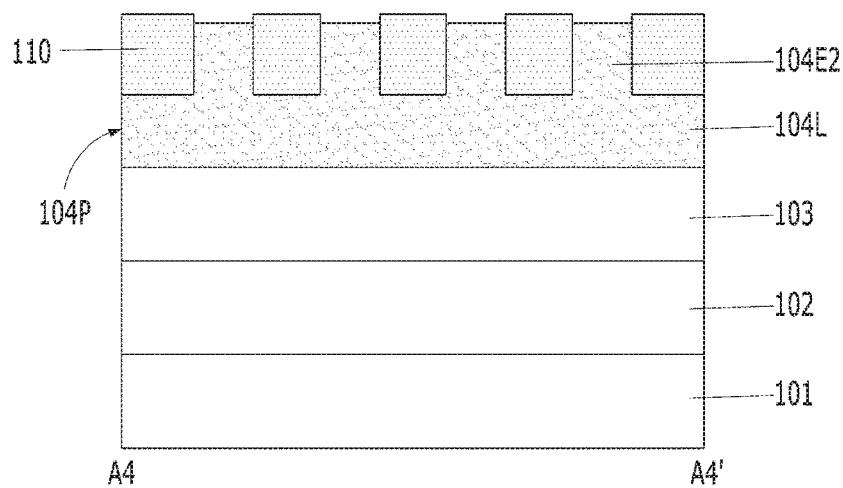

FIG. 9A is a cross-sectional view taken along an A1-A1' line of FIG. 1H. FIG. 9B is a cross-sectional view taken along an A2-A2' line of FIG. 1H. FIG. 9C is a cross-sectional view along an A3-A3' line of FIG. 1H. FIG. 9D is a cross-sectional view taken along an A4-A4' line of FIG. 1H.

Referring to FIGS. 1H and 9A to 9D, the upper sacrificial patterns 107P may be etched until the island-shaped masks 105I are exposed. The upper sacrificial patterns 107P may be etched by a blanket etch process, for example, an etch-back process.

Top surfaces of the island-shaped masks 105I may be fully exposed by the blanket etch process performed on the upper sacrificial patterns 107P. In other words, the upper sacrificial patterns 107P may be removed without any residues, that is both the upper body portion 107L and the plurality of the downwardly protruding portions 107E of the upper sacrificial patterns 107P may be fully removed by the etch process.

Figure 1I:
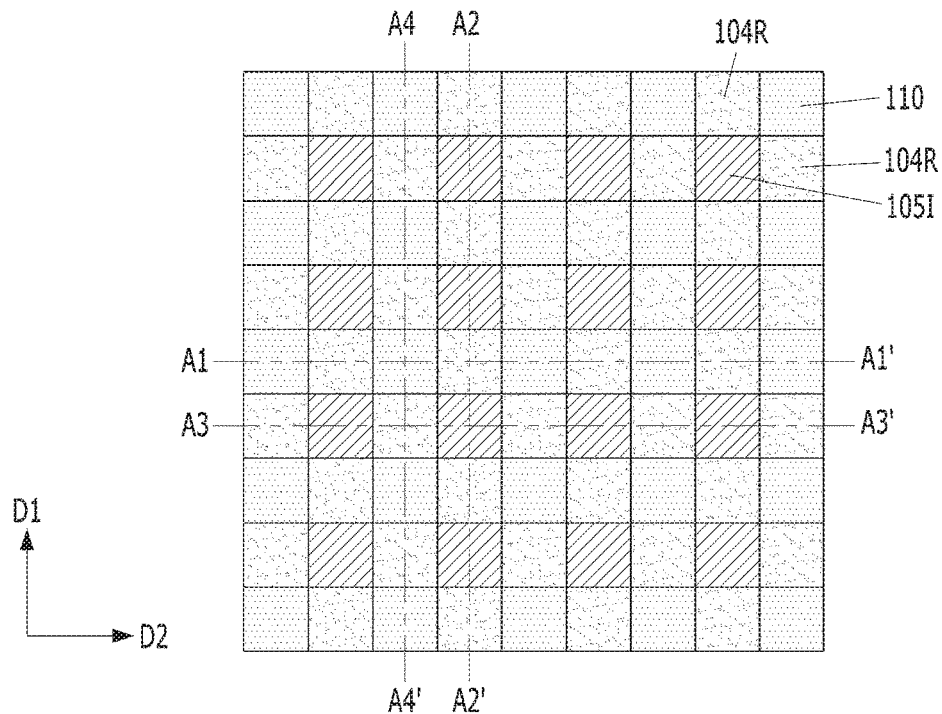
Figure 10A:
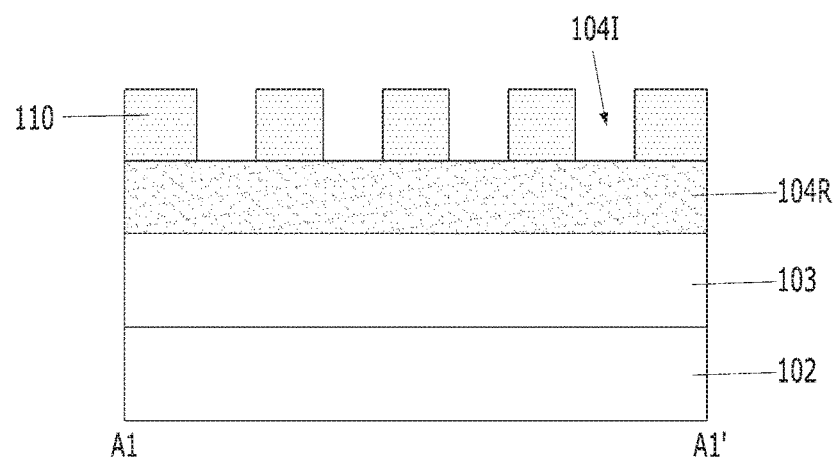
Figure 10B:
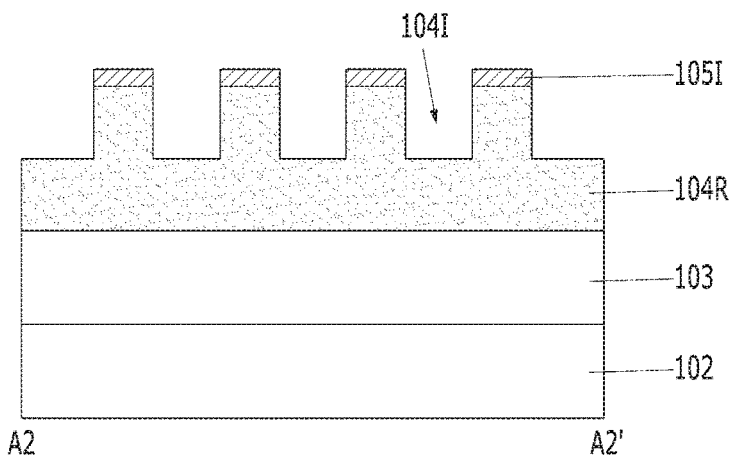
Figure 10C:
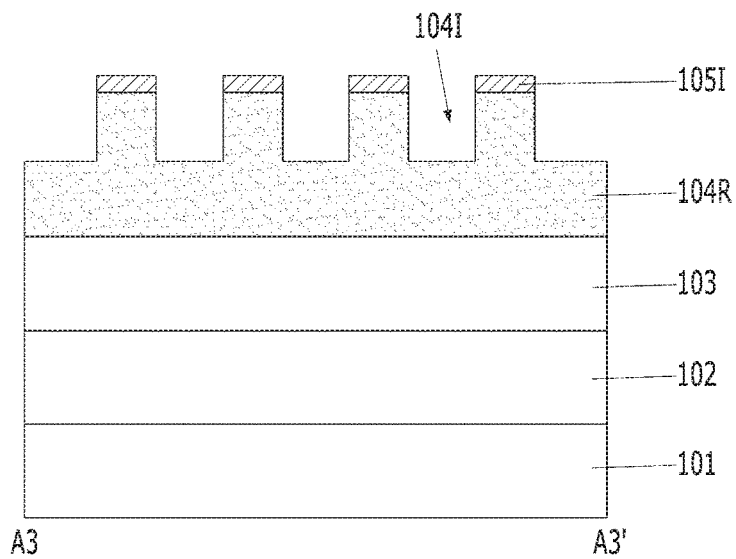
Figure 10D:
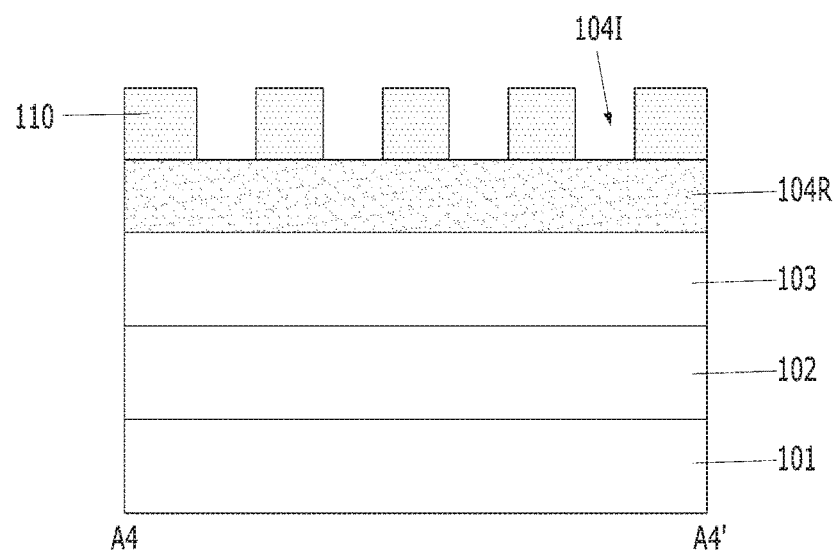

FIG. 10A is a cross-sectional view taken along an A1-A1' line of FIG. 1I. FIG. 10B is a cross-sectional view taken along an A2-A2' line of FIG. 1I. FIG. 10C is a cross-sectional view taken along an A3-A3' line of FIG. 1I. FIG. 10D is a cross-sectional view taken along an A4-A4' line of FIG. 1I.

Referring to FIGS. 1I and 10A to 10D, the lower sacrificial pattern 104P may be recessed in situ after the upper sacrificial patterns 107P are removed. The lower sacrificial pattern 104P may be recessed by a blanket etch process, for example, an etch-back process. A top surface of the remaining lower sacrificial pattern, that is, the recessed lower sacrificial pattern 104R, may be lower than top surfaces of the sacrificial pillars 110 and the island-shaped masks 105I.

Recessed patterns 104I may be defined between the island-shaped masks 105I and the sacrificial pillars 110 by the recessing process for forming the recessed lower sacrificial pattern 104R. The recessed patterns 104I may be arranged in a regular array. The recessed patterns 104I may have the same size. The recessed patterns 104I may be defined in the recessed lower sacrificial pattern 104R. The recessed patterns 104I may be discontinuous with one another. For example, the connection of adjacent recessed patterns 104I may be blocked by the contacting interfaces of the island-shaped masks 105I and the sacrificial pillars 110.

Figure 1J:
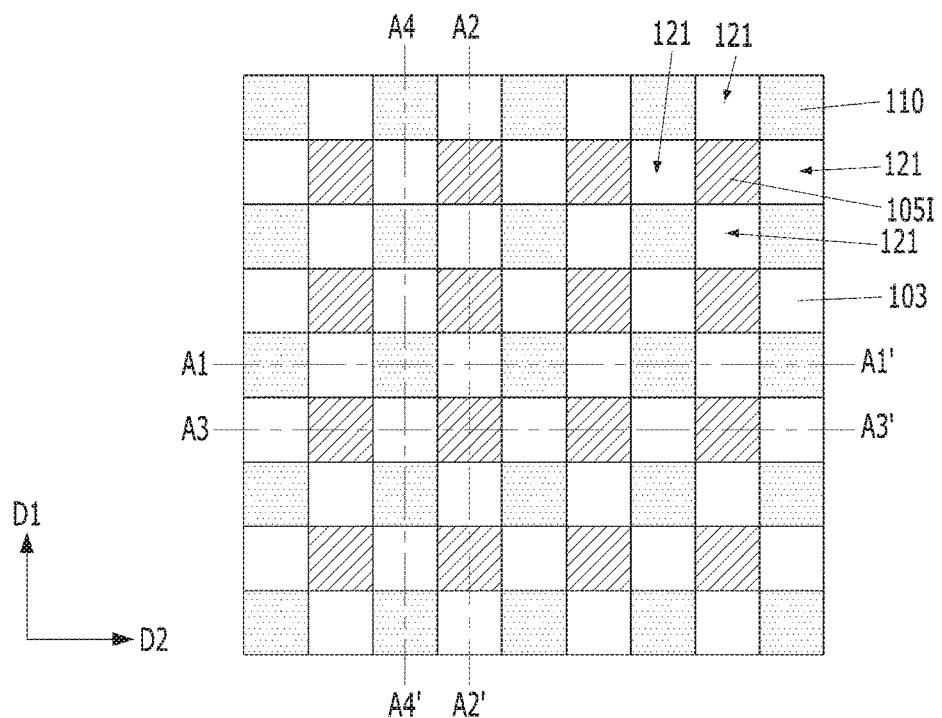
Figure 11A:
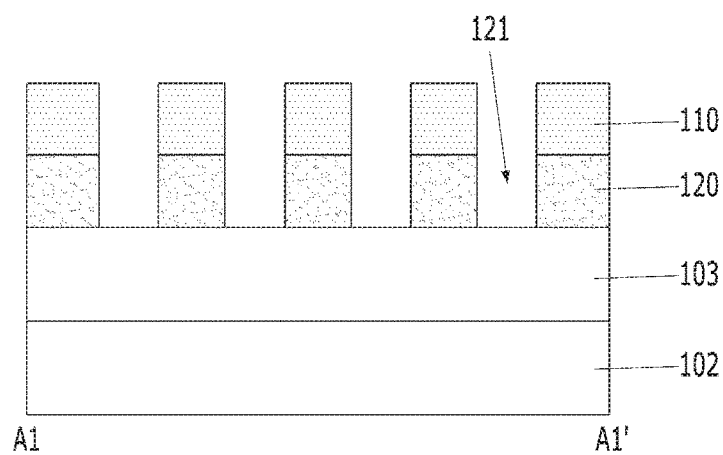
Figure 11B:
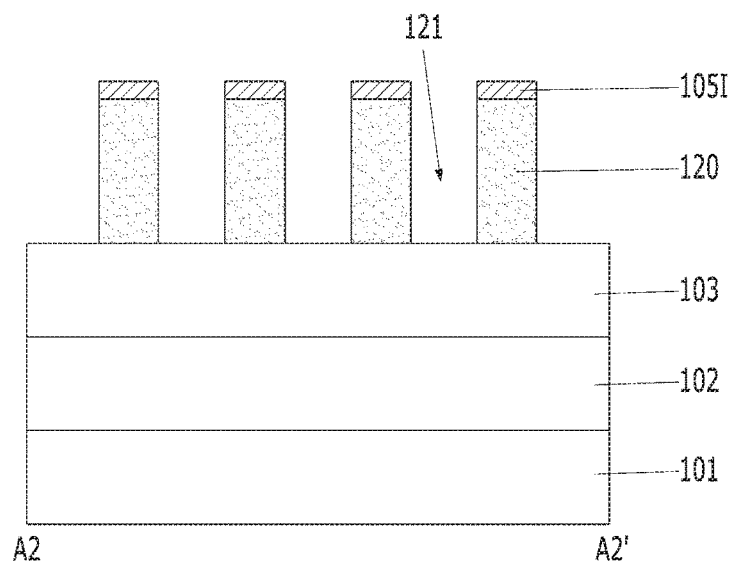
Figure 11C:
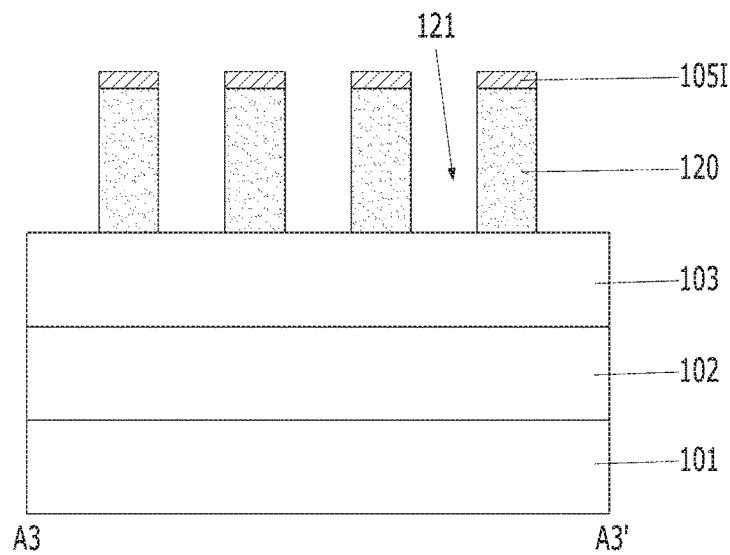
Figure 11D:
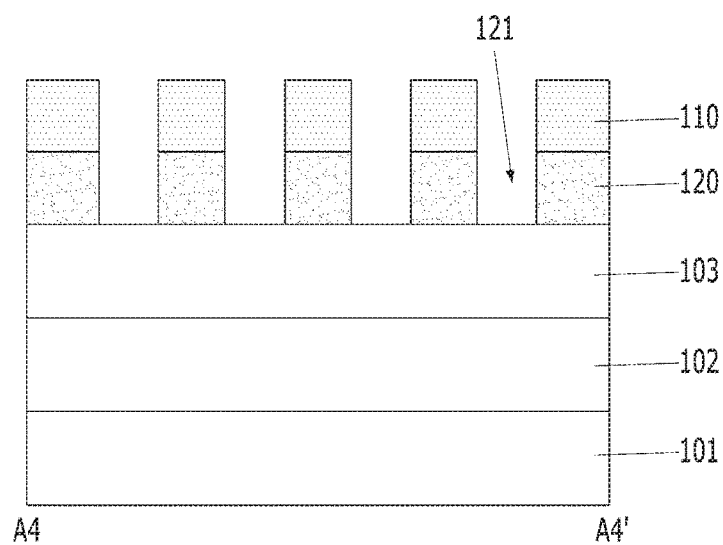

FIG. 11A is a cross-sectional view taken along an A1-A1' line of FIG. 1J. FIG. 11B is a cross-sectional view taken along an A2-A2' line of FIG. 1J. FIG. 11C is a cross-sectional view taken along an A3-A3' line of FIG. 1J. FIG. 11D is a cross-sectional view taken along an A4-A4' line of FIG. 1J.

Referring to FIGS. 1J and 11A to 11D, the recessed lower sacrificial pattern 104R may be etched using double hard masks of the island-shaped masks 105I and the sacrificial pillars 110. For example, portions of the recessed lower sacrificial pattern 104R may be etched through the recessed patterns 104I. Consequently, a sacrificial barrier 120 including a plurality of island-shaped openings 121 may be formed. The island-shaped openings 121 may have the same dimensions in the first and second directions D1, D2, as the recessed patterns 104I. The sacrificial barrier 120 refers to the recessed lower sacrificial pattern 104R that remains after the etch process. The plurality of island-shaped openings 121 may be spaced apart at a constant interval along the second direction D2. The plurality of island-shaped openings 121 may be also spaced apart at a constant interval along the first direction D1.

A top surface of the etch target material 103 may be partially exposed by the island-shaped openings 121.

Figure 1K:
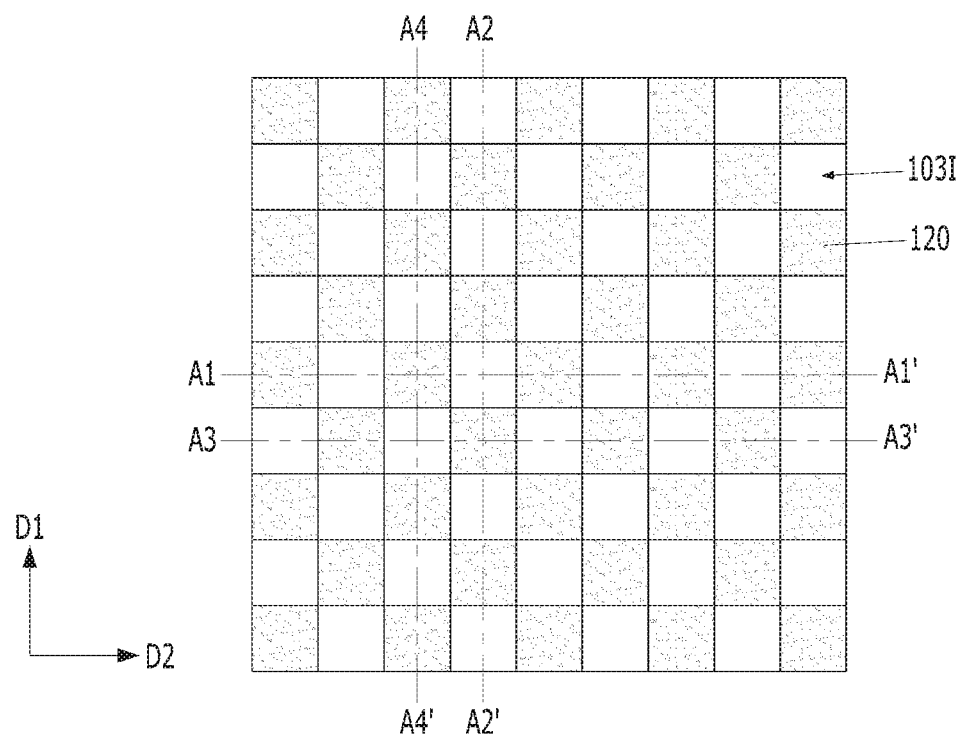
Figure 12A:
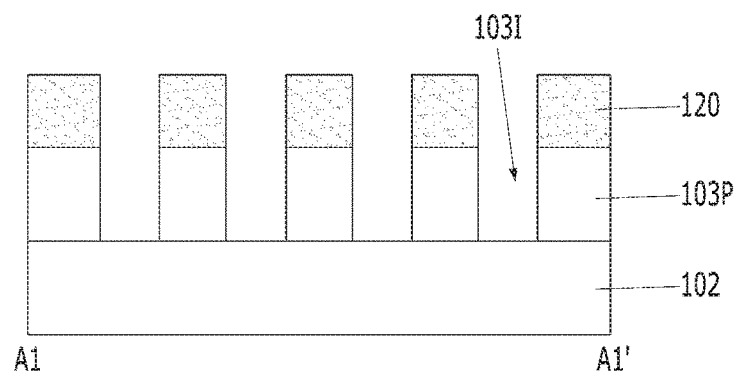
Figure 12B:
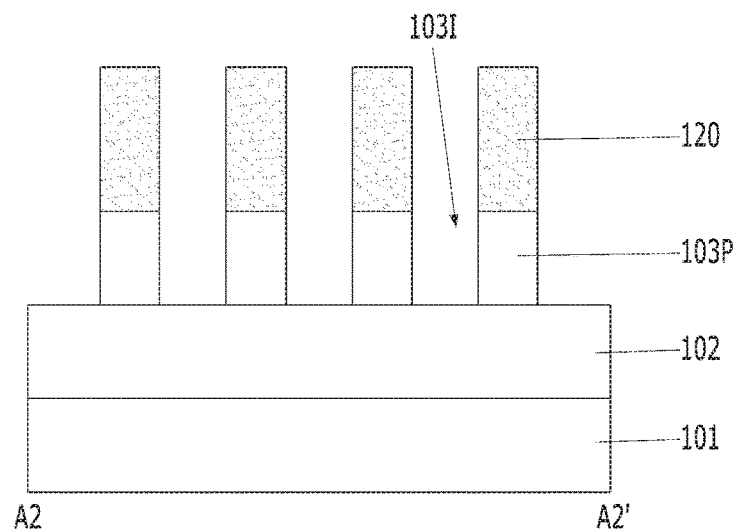
Figure 12C:
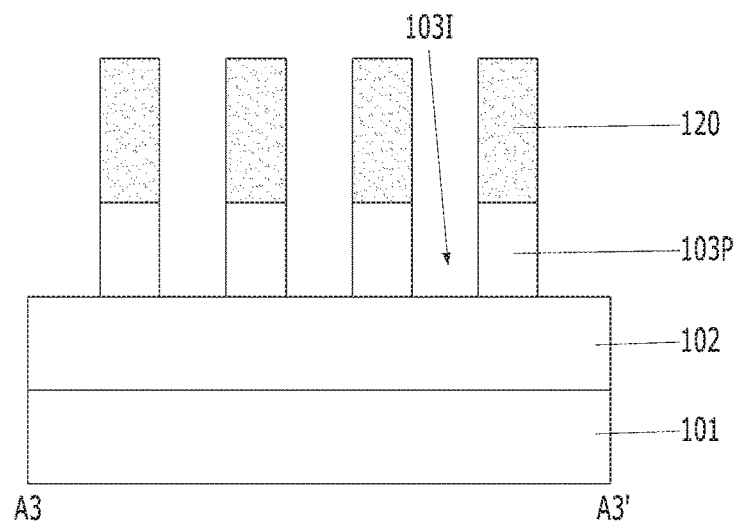
Figure 12D:
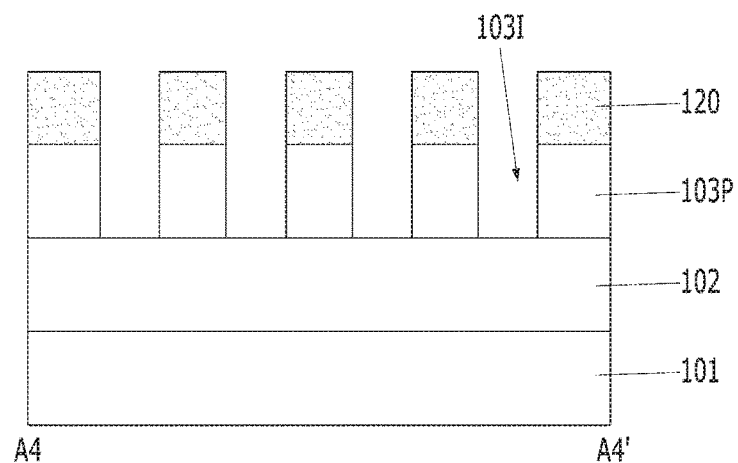

FIG. 12A is a cross-sectional view taken along an A1-A1' line of FIG. 1K. FIG. 12B is a cross-sectional view taken along an A2-A2' line of FIG. 1K. FIG. 12C is a cross-sectional view taken along an A3-A3' line of FIG. 1K. FIG. 12D is a cross-sectional view taken along an A4-A4' line of FIG. 1K.

Referring to FIGS. 1K and 12A to 12D, a plurality of island-shaped patterns 103I may be formed. To form the island-shaped patterns 103I, the etch target material 103 may be etched using the island-shaped masks 105I, the sacrificial pillars 110 and the sacrificial barrier 120 as etch masks. The island-shaped patterns 103I may be formed in etch target patterns 103P. The island-shaped patterns 103I may have the same dimensions, and may be spaced apart in a regular array at a constant interval therebetween.

The island-shaped masks 105I, the sacrificial pillars 110 and the sacrificial barrier 120 may be used as etch masks when the etch target material 103 is etched. While the etch target material 103 is etched, all of the island-shaped masks 105I and the sacrificial pillars 110 may be removed. However, since the sacrificial barrier 120 is also used as the etch mask, the etch process for the etch target material 103 may be completed to partially expose the lower material 102.

Subsequently, the sacrificial barrier 120 may be removed. Since the sacrificial barrier 120 is a carbon-containing material, the sacrificial barrier 120 may be removed by a photoresist strip process.

Figure 13:
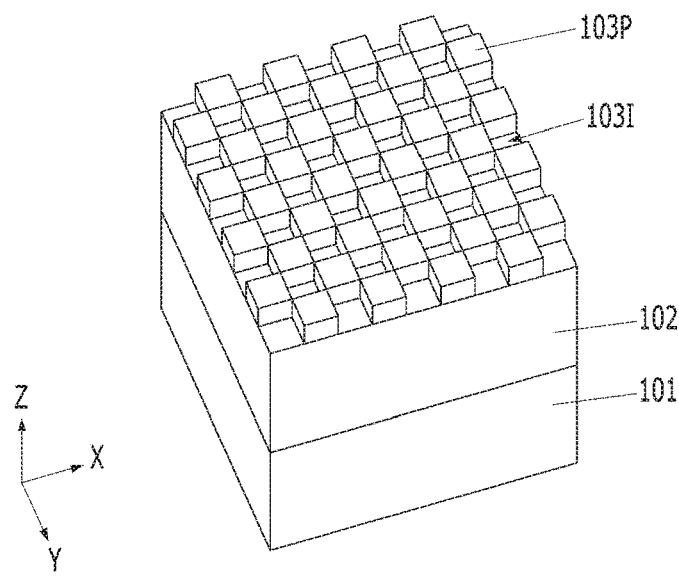
FIG. 13 is a perspective view illustrating island-shaped patterns.

FIG. 13 is a perspective view illustrating the island-shaped patterns 103I. The island-shaped patterns 103I may be formed in the etch target patterns 103P. The island-shaped patterns 103I may not be connected to one another.

Figure 14A:
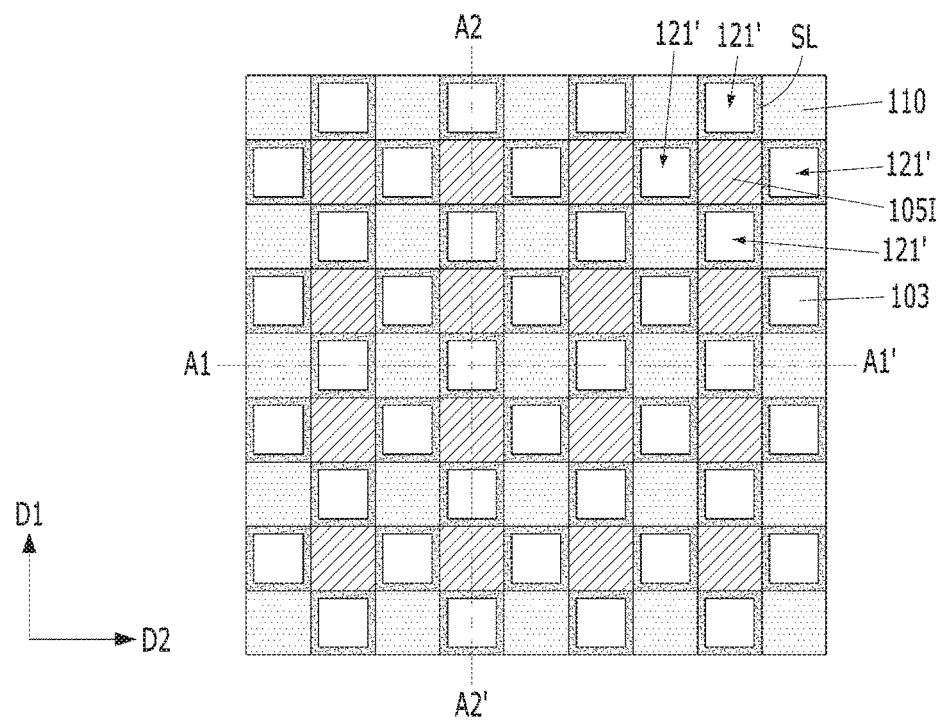
FIGS. 14A to 14C are diagrams for describing a method for forming patterns in accordance with an embodiment.
Figure 14B:
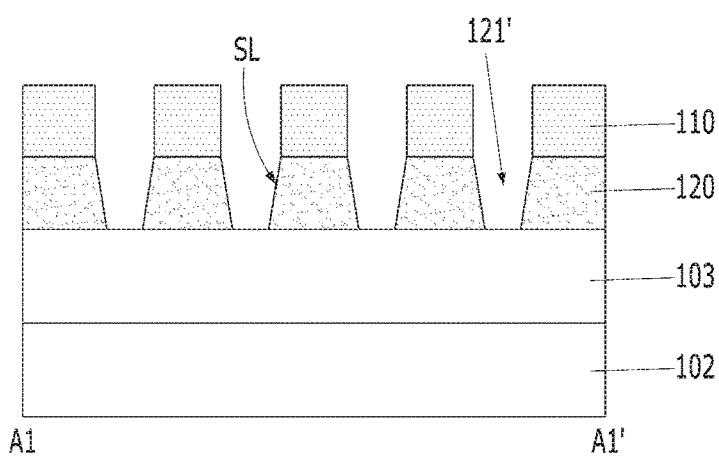
Figure 14C:
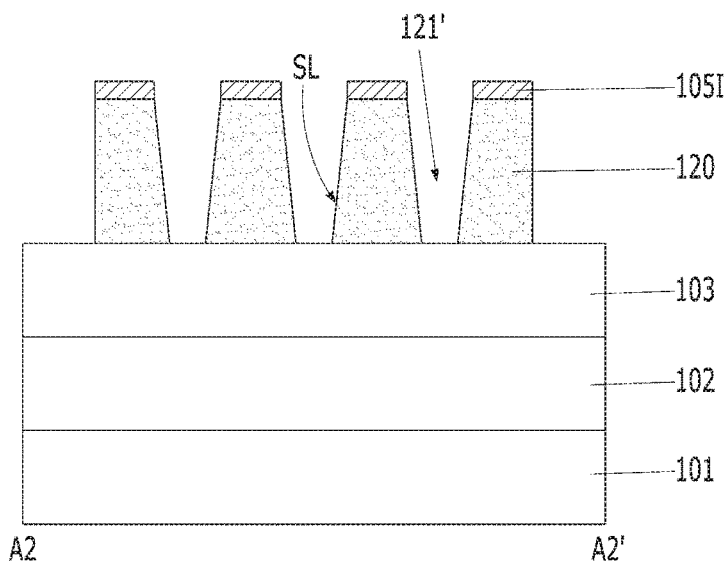

FIGS. 14A to 14C are diagrams for describing a method for forming patterns in accordance with an embodiment. FIG. 14A is a plan view. FIG. 14B is a cross-sectional view taken along an A1-A1' line of FIG. 14A. FIG. 14C is a cross-sectional view taken along an A2-A2' of FIG. 14A.

The double hard masks of the island-shaped masks 105I and the sacrificial pillars 110 may be formed by the methods described above with reference to FIGS. 1A to 1I and FIGS. 2A to 10D. Subsequently, the recessed lower sacrificial pattern 104R may be etched using the double hard masks of the island-shaped masks 105I and the sacrificial pillars 110. For example, portions of the recessed lower sacrificial pattern 104R may be etched through the recessed patterns 104I.

Accordingly, an etch barrier 120 having a plurality of island-shaped openings 121' as shown in FIGS. 14A to 14C may be formed. The island-shaped openings 121' may have shapes into which the shapes of the recessed patterns 104I are transferred. The etch barrier 120 may refer to the recessed lower sacrificial pattern 104R remaining after the etch process. A top surface of the etch target material 103 may be partially exposed by the island-shaped openings 121'.

For example, the island-shaped openings 121 shown in FIGS. 11A and 11B have vertical sidewalls, whereas the island-shaped openings 121' shown in FIGS. 14B and 14C may have sloped sidewalls (SL). A bridge between adjacent island-shaped openings 121' may be prevented by the sloped sidewalls SL. The bottom width of the island-shaped openings 121' may be smaller than the top width thereof.

Referring to FIG. 1J, the island-shaped openings 121 according to the previous embodiment may have rectangular shapes, and the island-shaped openings 121' shown in FIG. 14A may have smaller rectangular shapes than the island-shaped openings 121.

When the etch barrier 120 having the island-shaped openings 121' as described above is used, the size of the island-shaped patterns 103I formed by the subsequent etch process for the etch target material 103 may be decreased.

Figure 15A:
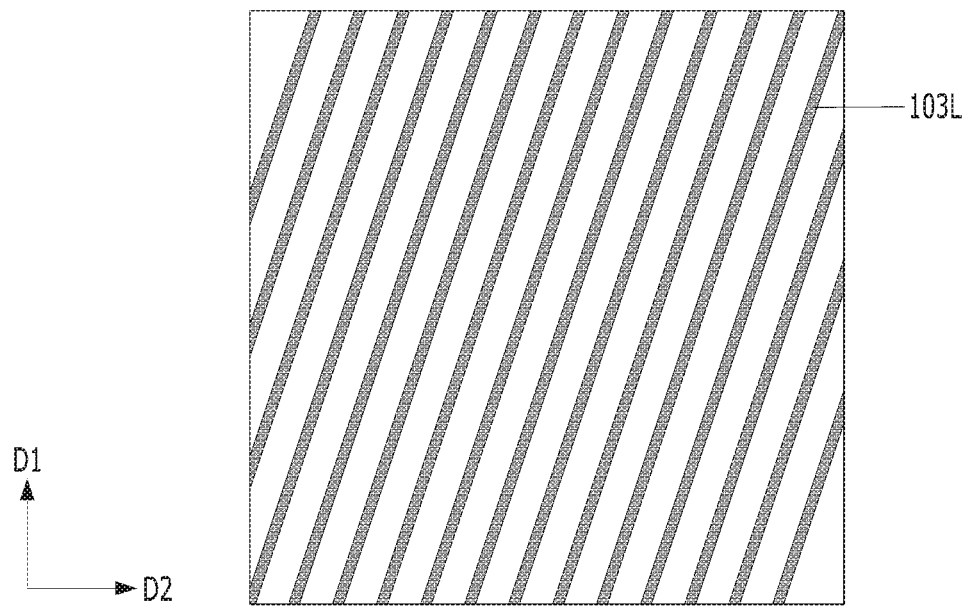
FIGS. 15A and 15B are diagrams for describing a method for forming patterns in accordance with an embodiment.
Figure 15B:
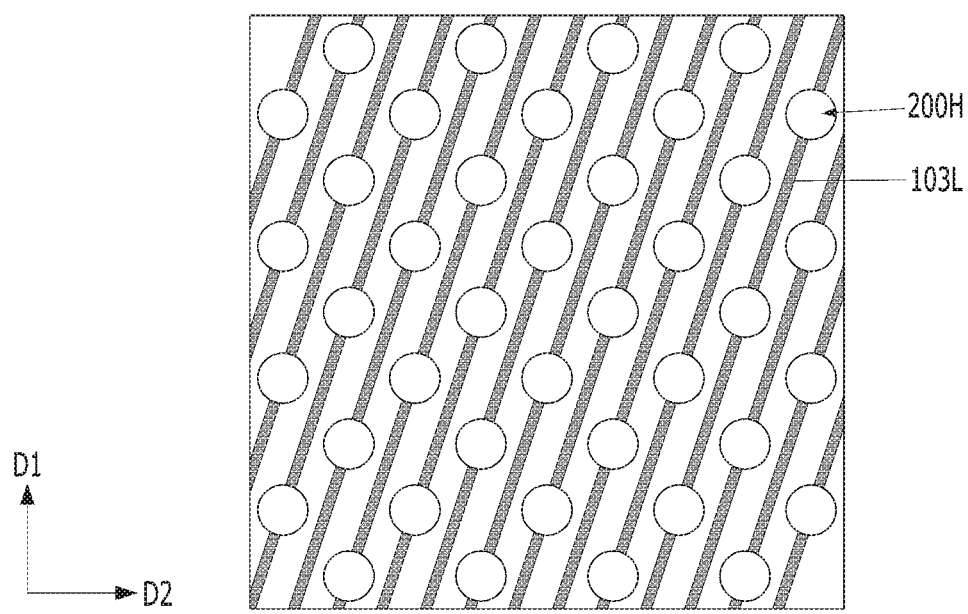

FIGS. 15A and 15B are diagrams for describing a method for forming patterns in accordance with an embodiment.

Referring to FIGS. 2A and 15A, the patterning of the etch target material 103 may be performed before the first sacrificial material 104 is formed. The etch target material 103 may be patterned in a line shape. This is referred to as an etch target line 103L. From the perspective of a top view with reference to FIG. 15A, a plurality of etch target lines 103L may have linear shapes extending in any one direction. The etch target lines 103L may intersect with the first mask lines 105L and the second mask lines 108L in a diagonal direction.

After the etch target lines 103L are formed, the first sacrificial material 104 may be formed. Hereinafter, the etch target lines 103L may be etched by the methods described above with reference to FIGS. 1A to 1K and 2A to 12D.

Accordingly, referring to FIG. 15B, the etch target lines 103L may be divided into a plurality of island-shaped patterns. The divided etch target lines 103L may be spaced apart from one another by isolation holes 200H. The isolation holes 200H may have shapes into which the shapes of the island-shaped openings 121 and 121' are transferred. For example, the etch target lines 103L may be cut through the island-shaped openings 121 and 121', and the cut portions may form the isolation holes 200H.

The process of forming the divided etch target lines 103L and the isolation holes 200H may be referred to as a cutting etch process of the etch target lines 103L.

The island-shaped masks 105I, the sacrificial pillars 110 and the sacrificial barrier 120 may be used as etch masks during the cutting etch process of the etch target lines 103L. All of the island-shaped masks 105I and the sacrificial pillars 110 may be removed during the cutting etch process of the etch target lines 103L. However, since the sacrificial barrier 120 is used as the etch mask, the cutting etch process of the etch target lines 103L may be completed.

Figure 16A:
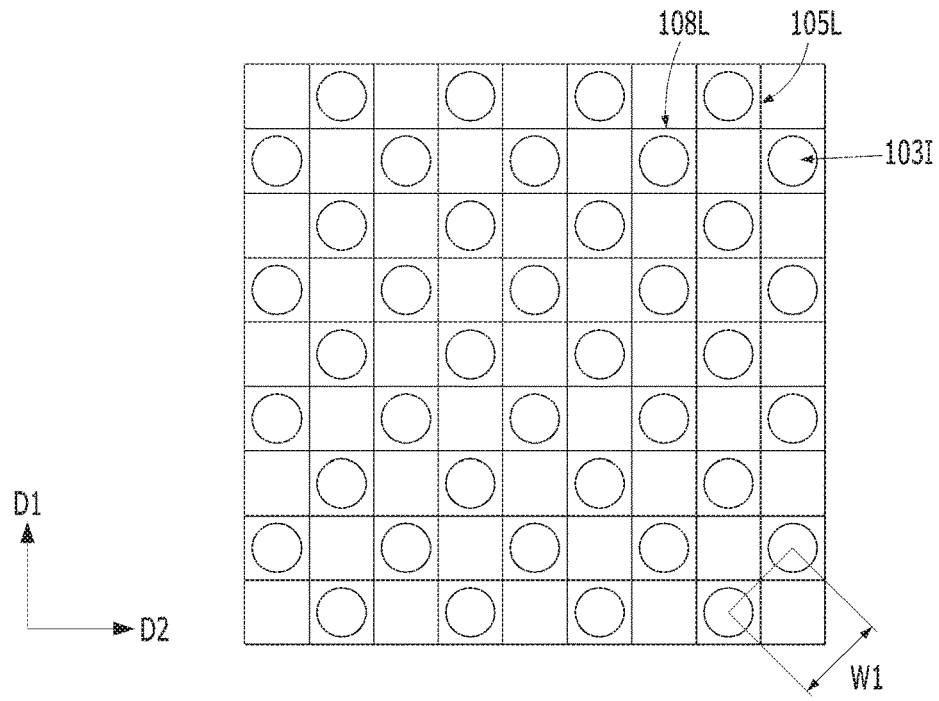
FIG. 16A is a diagram illustrating an array of island-shaped patterns in accordance with an embodiment.
Figure 16B:
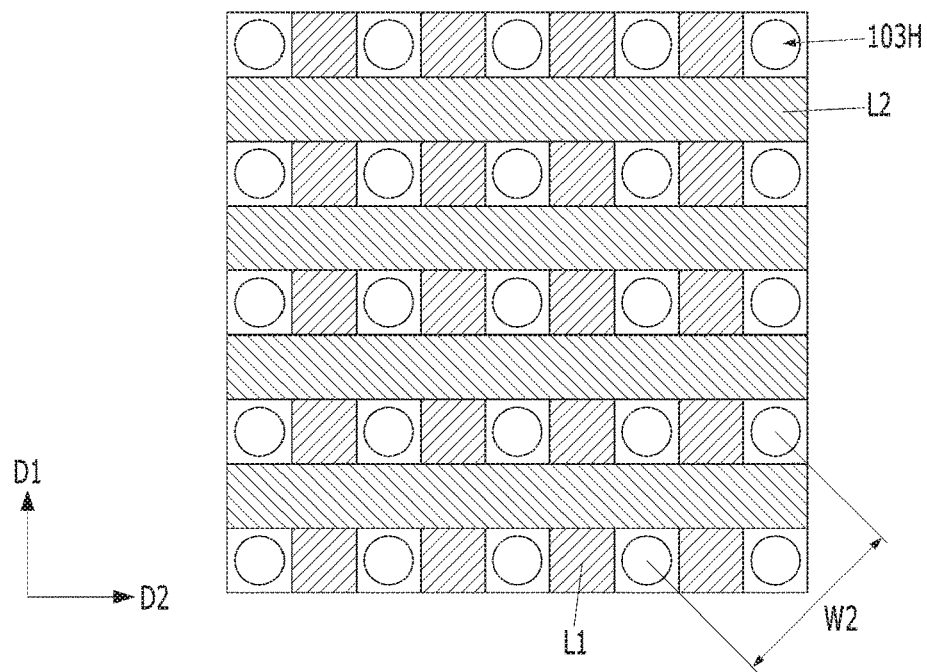
FIG. 16B is a diagram illustrating a pattern array according to a comparative example.

FIG. 16A is a diagram illustrating an array of the island-shaped patterns 103I in accordance with an embodiment. FIG. 16B is a diagram illustrating a pattern array according to a comparative example.

FIG. 16A illustrates the island-shaped patterns 103I formed by using the island-shaped masks 105I, the sacrificial pillars 110 and the sacrificial barrier 120 as described above as etch masks.

In the comparative example of FIG. 16B, hole patterns 103H may be defined at non-intersections of the first mask lines L1 and the second mask lines L2. In other words, the hole patterns 103H may be formed by an etch process using the first mask lines L1 and the second mask lines L2.

Referring to FIGS. 16A and 16B, the distance between the central axes of the island-shaped patterns 103I according to the embodiments may be set to a first length W1. The distance between the central axes of the hole patterns 103H according to the comparative example may be set to a second length W2. The distance W1 between the central axes of the island-shaped patterns 103I may be smaller than the distance W2 between the central axes of the hole patterns 103H.

As described above, the island-shaped patterns 103I according to the embodiments may be formed as a larger number of dense pattern arrays.

In some embodiments, the above-described embodiments may be applied to an isolation process for forming a plurality of island-shaped active regions. For example, the lower material 102 and the substrate 101 may be sequentially etched using the island-shaped patterns 103I and the etch target patterns 103P as etch masks.

As described above, an isolation trench may be formed by etching the substrate 101. The plurality of island-shaped active regions may be formed in the substrate 101 by the isolation trench. The dense island-shaped active regions may be formed according to the above-described embodiments.

According to the embodiments, a larger number of dense island-shaped patterns may be formed since island-shaped openings are formed using sacrificial pillars and island-shaped masks.

According to the embodiments, the controllability and uniformity of a threshold dimension as well as the overlay control are excellent.

The embodiments may reduce a mask step while simplifying the fine pattern formation process, thereby reducing the process cost.

While the present invention has been described with respect to the specific embodiments, it should be noted that the embodiments are for describing, not limiting, the present invention. Further, it should be noted that the present invention may be achieved in various ways through substitution, change, and modification, by those skilled in the art without departing from the scope of the present invention as defined by the following claims.

What is claimed is:

1. A method for forming patterns comprising:
   forming an etch barrier stack in which a first sacrificial material, first mask lines, a second sacrificial material and second mask lines intersecting with the first mask lines are sequentially disposed on an etch target material;
   etching the second sacrificial material and the first sacrificial material using the second and first mask lines as etch masks to form island-shaped sacrificial openings isolated from one another in the first sacrificial material;
   forming island-shaped sacrificial pillars to fill the island-shaped sacrificial openings;
   etching the first mask lines to form island-shaped masks at intersections between the first mask lines and the second mask lines; and
   etching the first sacrificial material using the island-shaped masks and the island-shaped sacrificial pillars as etch masks to form a sacrificial barrier including island-shaped openings that are isolated from one another and expose the etch target material.

2. The method of claim 1, further comprising etching the etch target material using the sacrificial barrier as an etch mask to form island-shaped patterns isolated from one another in the etch target material, after the forming of the sacrificial barrier.

3. The method of claim 1, wherein the first mask lines and the second mask lines are formed to intersect each other.

4. The method of claim 1, wherein each of the first and second sacrificial materials includes a carbon-containing material formed by spin-on-coating.

5. The method of claim 1, wherein each of the first and second mask lines includes silicon oxynitride.

6. The method of claim 1, wherein each of the island-shaped sacrificial pillars includes polysilicon or oxide.

7. The method of claim 1, wherein the island-shaped sacrificial openings are formed to be aligned with empty spaces defined by the intersections between the second mask lines and the first mask lines.

8. The method of claim 1, wherein the etching of the first mask lines to form the island-shaped masks at the intersections between the first mask lines and the second mask lines includes cutting the first mask lines simultaneously while removing the second mask lines.

9. The method of claim 1, wherein the forming of the etch barrier stack includes:
   forming the first sacrificial material on the etch target material;
   forming the first mask lines in linear shapes on the first sacrificial material;
   forming the second sacrificial material on the first mask lines; and
   forming the second mask lines in linear shapes on the second sacrificial material, the second mask lines intersecting with the first mask lines.

10. The method of claim 9, wherein each of the forming of the first mask lines and the forming of the second mask lines includes:
    forming a mask material,
    forming photoresist patterns in line/space shapes on the mask material; and
    etching the mask material using the photoresist patterns as etch masks.

11. A method for forming patterns comprising:
    forming etch target lines isolated from one another over a substrate;
    forming an etch barrier stack in which a first sacrificial material, first mask lines, a second sacrificial material and second mask lines intersecting with the first mask lines are sequentially disposed on the etch target lines;
    sequentially etching the second sacrificial material and the first sacrificial material using the second and first mask lines as etch masks to form island-shaped sacrificial openings isolated from one another in the first sacrificial material;
    forming island-shaped sacrificial pillars to fill the island-shaped sacrificial openings;
    etching the first mask lines to form island-shaped masks at intersections between the first mask lines and the second mask lines;
    etching the first sacrificial material using the island-shaped masks and the island-shaped sacrificial pillars as etch masks to form a sacrificial barrier including island-shaped openings that are isolated from one another to partially expose the etch target lines; and
    etching the etch target lines using the sacrificial barrier as an etch mask to form island-shaped patterns isolated from one another and isolation holes by cutting the etch target lines.

12. The method of claim 11, wherein the etch target lines are formed to intersect with the first and second mask lines, and the first and second mask lines intersect perpendicularly to each other.

13. The method of claim 11, wherein each of the first and second sacrificial materials includes a carbon-containing material formed by spin-on-coating.

14. The method of claim 11, wherein each of the first and second mask lines includes silicon oxynitride.

15. The method of claim 11, wherein each of the island-shaped sacrificial pillars includes polysilicon or oxide.

16. The method of claim 11, wherein the island-shaped sacrificial openings are formed to be aligned with empty spaces defined by the intersections between the second mask lines and the first mask lines.

17. The method of claim 11, wherein the etching of the first mask lines to form the island-shaped masks at the intersections between the first mask lines and the second mask lines includes cutting the first mask lines simultaneously while removing the second mask lines.

18. The method of claim 11, wherein the forming of the etch barrier stack includes:
    forming the first sacrificial material on the etch target material;
    forming the first mask lines in linear shapes on the first sacrificial material;

forming the second sacrificial material on the first mask lines; and forming the second mask lines in linear shapes on the second sacrificial material, the second mask lines intersecting with the first mask lines.

19. The method of claim 18, wherein each of the forming of the first mask lines and the forming of the second mask lines includes:

forming a mask material;

forming photoresist patterns in line/space shapes on the mask material; and etching the mask material using the photoresist patterns as etch masks.

20. The method of claim 11, further comprising etching the substrate using the island-shaped patterns as etch masks to form a plurality of active regions and trenches in the substrate, after the etching of the etch target lines using the sacrificial barrier as the etch mask to form the isolated island-shaped patterns and the isolation holes by cutting the etch target lines.

* * * * *